United States Patent
Lee et al.

(10) Patent No.: US 9,748,953 B2
(45) Date of Patent: Aug. 29, 2017

(54) MEMORY MODULES INCLUDING PLURAL MEMORY DEVICES ARRANGED IN ROWS AND MODULE RESISTOR UNITS

(71) Applicant: SAMSUNG ELECTRONICS CO., LTD., Suwon-si, Gyeonggi-do (KR)

(72) Inventors: Jae-Jun Lee, Seongnam-si (KR); Do-Hyung Kim, Hwaseong-si (KR); Yong-Jin Kim, Icheon (KR); Bo-Ra Kim, Seoul (KR); Jeong-Hoon Baek, Busan (KR); Kwang-Seop Kim, Yongin-si (KR); Da-Ae Heo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 18 days.

(21) Appl. No.: 15/202,839

(22) Filed: Jul. 6, 2016

(65) Prior Publication Data

US 2016/0315614 A1  Oct. 27, 2016

Related U.S. Application Data

(62) Division of application No. 13/827,797, filed on Mar. 14, 2013, now Pat. No. 9,412,423.

(60) Provisional application No. 61/611,095, filed on Mar. 15, 2012.

(30) Foreign Application Priority Data

Sep. 19, 2012  (KR) ........................ 10-2012-0103735

(51) Int. Cl.
*H03K 19/00* (2006.01)
*G11C 7/00* (2006.01)
*G11C 5/04* (2006.01)

(52) U.S. Cl.
CPC .......... *H03K 19/0005* (2013.01); *G11C 5/04* (2013.01); *G11C 7/00* (2013.01)

(58) Field of Classification Search
CPC ... G11C 5/04; H01L 2924/00; G06F 13/4086; H05K 1/0246; H04L 25/0278
See application file for complete search history.

(56) References Cited

U.S. PATENT DOCUMENTS

| 5,663,661 A | 9/1997 | Dillon et al. |
| 5,668,834 A * | 9/1997 | Takekuma .......... G06F 13/4072 326/30 |
| 5,955,889 A | 9/1999 | Taguchi et al. |
| 6,125,419 A * | 9/2000 | Umemura .......... G06F 13/4086 710/110 |

(Continued)

FOREIGN PATENT DOCUMENTS

| JP | 11074449 | 3/1999 |
| KR | 1020070030518 A | 3/2007 |
| KR | 1020110044501 A | 4/2011 |

*Primary Examiner* — Hoai V Ho
*Assistant Examiner* — Roberto Mancera, Jr.
(74) *Attorney, Agent, or Firm* — Volentine & Whitt, PLLC

(57) ABSTRACT

A memory module includes a command/address (CA) register, memory devices, and a module resistor unit mounted on a circuit board. The centrally disposed CA register drive the memory devices one or more internal CA signal(s) to arrangements of memory devices using multiple CA transmission lines, wherein the multiple internal CA transmission lines are commonly terminated in the module resistor unit.

1 Claim, 20 Drawing Sheets

(56) References Cited

U.S. PATENT DOCUMENTS

| | | |
|---|---|---|
| 6,208,546 B1 | 3/2001 | Ikeda |
| 6,665,736 B1 | 12/2003 | Fan |
| 7,439,789 B2 | 10/2008 | Nguyen |
| 7,716,401 B2 | 5/2010 | Lee |
| 7,869,243 B2 * | 1/2011 | Bacha .................... G11C 5/025 361/760 |
| 8,243,534 B2 | 8/2012 | Fujisawa |
| 8,619,492 B2 * | 12/2013 | Jeon .................... G11C 7/1057 326/26 |
| 9,082,464 B2 * | 7/2015 | Sung .................... G11C 5/04 |
| 2003/0031060 A1 | 2/2003 | Nishio et al. |
| 2004/0044833 A1 | 3/2004 | Ryan |
| 2004/0071040 A1 | 4/2004 | Funaba et al. |
| 2004/0133736 A1 | 7/2004 | Kyung |
| 2005/0007835 A1 | 1/2005 | Lee et al. |
| 2005/0055499 A1 | 3/2005 | Leddige et al. |
| 2005/0097264 A1 | 5/2005 | Park et al. |
| 2005/0105318 A1 | 5/2005 | Funaba et al. |
| 2005/0174878 A1 | 8/2005 | Osaka et al. |
| 2005/0212551 A1 | 9/2005 | So et al. |
| 2006/0123265 A1 | 6/2006 | Ruckerbauer et al. |
| 2006/0126369 A1 | 6/2006 | Raghuram |
| 2006/0129712 A1 | 6/2006 | Raghuram |
| 2006/0152259 A1 | 7/2006 | Lee et al. |
| 2007/0127304 A1 | 6/2007 | Yoon et al. |
| 2007/0201256 A1 | 8/2007 | RaghuRam |
| 2007/0216445 A1 | 9/2007 | Raghavan et al. |
| 2007/0258278 A1 | 11/2007 | Bacha et al. |
| 2008/0030221 A1 | 2/2008 | Lee |
| 2008/0284465 A1 | 11/2008 | Kao |
| 2010/0161874 A1 | 6/2010 | Chennupati |
| 2010/0208535 A1 | 8/2010 | Fujisawa |
| 2010/0226185 A1 | 9/2010 | Lee |
| 2010/0309706 A1 | 12/2010 | Saito et al. |
| 2010/0312925 A1 | 12/2010 | Osanai et al. |
| 2010/0312956 A1 | 12/2010 | Hiraishi et al. |
| 2010/0312995 A1 | 12/2010 | Sung |
| 2011/0095783 A1 | 4/2011 | Ferolito et al. |
| 2011/0096583 A1 | 4/2011 | Seok et al. |
| 2011/0110168 A1 | 5/2011 | Sung |
| 2011/0145493 A1 | 6/2011 | Ahn et al. |
| 2011/0242916 A1 | 10/2011 | Seol et al. |
| 2011/0242924 A1 | 10/2011 | Kim et al. |
| 2012/0250264 A1 | 10/2012 | Osanai et al. |
| 2013/0063998 A1 | 3/2013 | Harashima |
| 2013/0135916 A1 | 5/2013 | Osanai et al. |
| 2013/0138898 A1 | 5/2013 | Osanai et al. |
| 2014/0002131 A1 | 1/2014 | Shaeffer |
| 2014/0052934 A1 | 2/2014 | Gopalakrishnan et al. |

* cited by examiner

921

MEMORY MODULES INCLUDING PLURAL MEMORY DEVICES ARRANGED IN ROWS AND MODULE RESISTOR UNITS

CROSS-REFERENCE TO RELATED APPLICATION

This is a Divisional of U.S. application Ser. No. 13/827,797, filed Mar. 14, 2013, now U.S. Pat. No. 9,412,423 issued on Aug. 9, 2016, which claims priority to U.S. Provisional Application No. 61/611,095 filed on Mar. 15, 2012, and to Korean Patent Application No. 10-2012-0103735 filed on Sep. 19, 2012, the collective subject matter of which is hereby incorporated by reference.

BACKGROUND

Embodiments of the inventive concept relate generally to data storage devices including one or more semiconductor memory devices. More particularly, embodiments of the inventive concept relate to memory modules including a plurality of semiconductor memory chips.

Contemporary memory modules are typically configured by mounting a plurality of semiconductor memory chips, such as Dynamic Random Access Memories (DRAMs) on a printed circuit board (PCB). The mounted semiconductor memory chips are capable of parallel operation and must therefore be able to simultaneously receive/transmit a variety of electrical signals (e.g., data, address and/or control signals).

Computational devices, such as processors, controllers, and digital logic circuits are increasingly required to communicate data at higher speeds and greater bandwidth. As a result, data storage devices must be capable of operating at increasingly high frequencies, and with greater data throughput. As a further result, the number of faster, smaller, and more densely integrated semiconductor memory chips mounted on contemporary memory modules is increasing. Hence, the overall configuration of memory modules is becoming more complicated and available physical space on many memory modules comes at a premium.

Adding to this growing complexity, it is usually necessary to ensure that the signal transmission pathways are properly terminated on a memory module in order to reduce or minimize impedance mismatches that may result in the loss or degradation of signal integrity.

SUMMARY

Certain embodiments of the inventive concept provide memory modules capable of better securing signal integrity without consuming undue area on the constituent circuit board of the memory module.

In one aspect, the inventive concept provides a memory module comprising; at least one command/address (CA) register disposed in a central portion of a circuit board having a first edge and an opposing second edge, wherein the CA register receives an external CA signal, and in response to the external CA signal, provides at least one internal CA signal, a plurality of memory devices arranged on the circuit board in a first row and a second row adjacent to the first row in a first direction, the first and second rows extending in a second direction between the first and second edges, wherein the plurality of memory devices includes a first sub-plurality of memory devices in the first row between the CA register and the first edge, a second sub-plurality of memory devices in the second row between the CA register and the first edge, a third sub-plurality of memory devices in the first row between the CA register and the second edge, and a fourth sub-plurality of memory devices in the second row between the CA register and the second edge, a first internal CA transmission line communicating a first internal CA signal from the CA register to the first sub-plurality of memory devices, a second internal CA transmission line communicating a second internal CA signal from the CA register to the second sub-plurality of memory devices, a third internal CA transmission line communicating a third internal CA signal from the CA register to the third sub-plurality of memory devices, and a fourth internal CA transmission line communicating a fourth internal CA signal from the CA register to the fourth sub-plurality of memory devices, a first module resistor unit providing a first termination resistance that terminates the first and second internal CA transmission lines, and a second module resistor unit providing a second termination resistance that terminates the third and fourth internal CA transmission lines.

In another aspect, the inventive concept provides a memory module comprising; a command/address (CA) register disposed at a central portion of a circuit board having a first edge and an opposing second edge, the CA register receives an external CA signal, and in response, provides a first internal CA signal and a second internal CA signal, a plurality of memory devices arranged on the circuit board in a first row and a second row adjacent to the first row in a first direction, wherein the first and second rows extend in a second direction between the first and second edges, a first internal CA transmission line extending from the CA register towards the second edge, and then proximate the second edge, extending back towards the first edge to traverse the entire first row in a fly-by, daisy-chain topology and communicate the first internal CA signal to each memory device in the first row, a second internal CA transmission line extending from the CA register towards the second edge, and then proximate the second edge, extending back towards the first edge to traverse the entire second row in a fly-by, daisy-chain topology and communicate the second internal CA signal to each memory device in the second row, and a module resistor unit providing a termination resistance that terminates the first and second internal CA transmission lines.

In yet another aspect, the inventive concept provides a memory module comprising; memory devices operating in response to a command/address (CA) signal and arranged on the circuit board having a first edge and an opposing second edge, wherein the memory devices are arranged in a first row and a second row adjacent to the first row in a first direction, wherein the first and second rows extend in a second direction between the first and second edges, a CA transmission line extending from a central portion of a lateral edge of the circuit board between the first and second edges towards the second edge, and branching proximate the second edge into a first CA transmission line branch and a second CA transmission line branch, wherein the first CA transmission line branch extends back towards the first edge to traverse the first row in a fly-by, daisy-chain topology and communicate the CA signal to each memory device in the first row, and the second CA transmission line branch extends back towards the first edge to traverse the second row in a fly-by, daisy-chain topology to communicate the CA signal to each memory device in the second row, and a module resistor unit disposed proximate the first edge and providing a termination resistance that terminates the first and second CA transmission line branches.

BRIEF DESCRIPTION OF THE DRAWINGS

Illustrative embodiments of the inventive concept are illustrated in the accompanying drawings.

DETAILED DESCRIPTION

Various embodiment of the inventive concepts will be described in some additional detail with reference to the accompanying drawings. The inventive concept may, however, be embodied in many different forms and should not be construed as limited to only the illustrated embodiments. Rather, the illustrated embodiments are provided so that this disclosure will be thorough and complete, and will fully convey the scope of the inventive concept to those skilled in the art. Throughout the written description and drawings, like reference numbers and label are used to denote like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
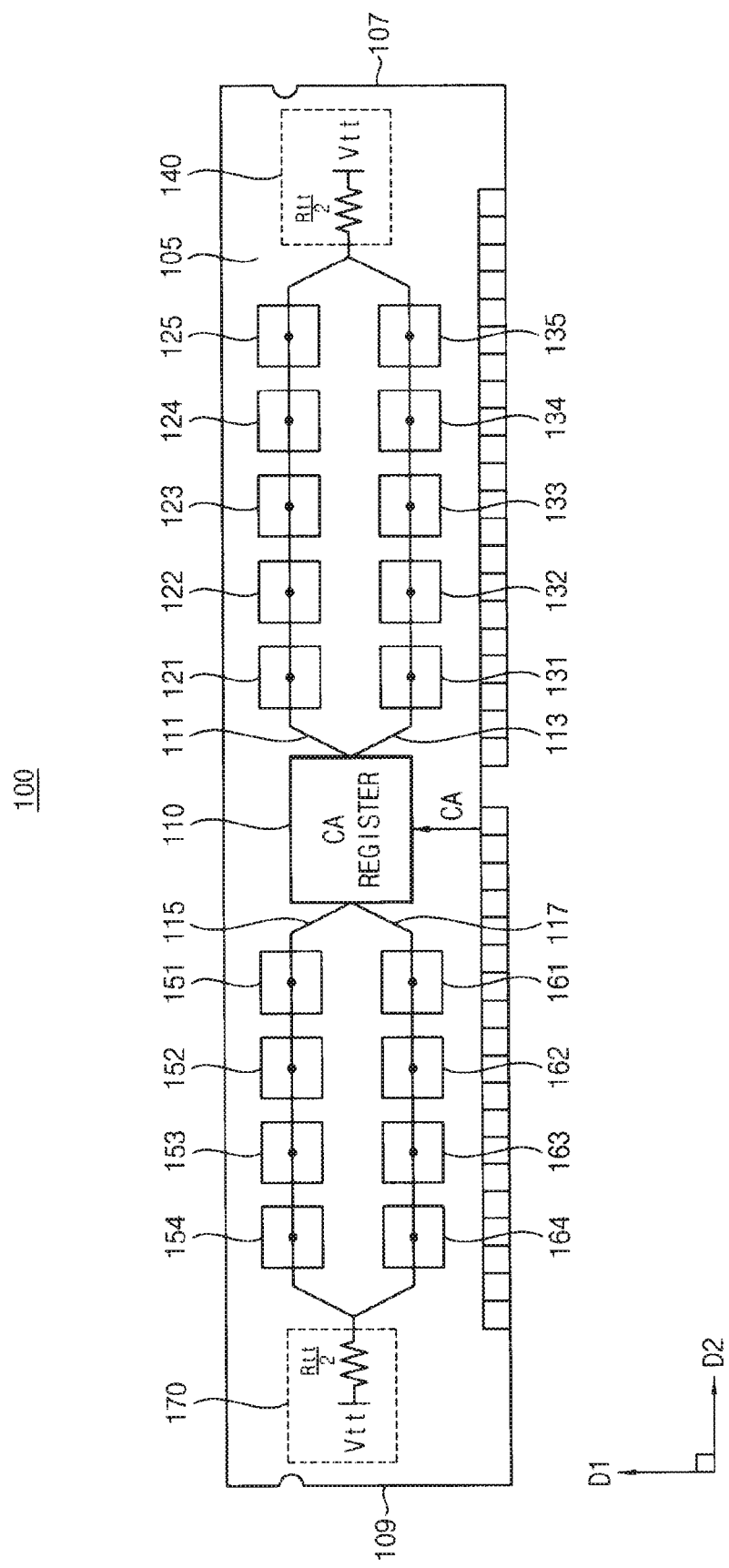
FIG. 1, FIG. 2, FIG. 3, FIG. 4, FIG. 5, FIG. 6 and FIG. 7 are each a block diagram respectively illustrating a memory module according to certain embodiments of the inventive concept.

Figure (FIG. 1 is a block diagram illustrating a memory module according to an embodiment of the inventive concept.

Referring to FIG. 1, a memory module 100 includes a command/address (CA) register 110, a plurality of memory devices 121~125, 131~135, 151~154 and 161~164 and module resistor units 140 and 170 collectively mounted on a circuit board 105. The CA register 110 is arranged in relation to memory devices 121~125 and 131~135, as well as the memory devices 151~154 and 161~164 in respective "fly-by ring" topologies.

The circuit board 105 extends in an arbitrarily defined "second" direction D2 between a first edge 107 and an opposing second edge 109 in relation to an orthogonally defined "first" direction D1. The CA register 110 is arranged proximally to a central portion of the circuit board 105, and the memory devices 121~125, 131~135, 151~154 and 161~164 are arranged in a plurality of rows extending from the CA register 110 towards one of the first and second edges 107 and 109 along the second direction D2. While only one CA register 110 and two (2) rows are shown in the illustrated example of FIG. 1, those skilled in the art will recognize that more than one CA register may be used and/or the constituent plurality of memory devices may be arranged in more than two rows.

However, in the illustrated example of FIG. 1, the memory devices 121~125 (a first sub-plurality) and the memory devices 131~135 (a second sub-plurality) are arranged in respective rows between the CA register 110 and the first edge 107, while the memory devices 151~154 (a third sub-plurality) and the memory devices 161~164 (a fourth sub-plurality) are arranged in respective rows between the CA register 110 and the second edge 109. It is assumed that at least memory device in the first sub-plurality of memory devices 121~125 and/or at least one memory device in the second sub-plurality of memory devices 131~135 is capable of performing at least one error detection and/or correction (ECC) operation. A memory device capable of performing an ECC operation will hereafter be referred to as an "ECC memory device".

The CA register 110 receives certain conventionally understood command and/or address signal(s) via a CA transmission line connected to an external device (e.g., a memory controller or processor). The CA signals received by the CA register 110 will hereafter be referred to singularly or collectively as the "external CA signal". Each one of the plurality of memory devices 121~125, 131~135, 151~154 and 161~164 receives a corresponding data signal via one or more data transmission lines (not shown in FIG. 1 for clarity). It should be noted at this point the term "line(s)", as in "transmission line(s)", is used to denote an arrangement of conductive elements capable of communicating an electrical signal. Those skilled in the art will understand that a "line" may include in many different combinations a metal traces, wires, vias, pads, taps, passive and active elements and material layer regions, etc.

In response to the external CA signal, the CA register 110 is capable of providing corresponding "internal CA signal(s)" to one or more of the plurality of memory devices. For example, a first internal CA signal may be communicated from the CA register 110 to one or more of the memory devices in the first sub-plurality of memory devices 121~125 via a first CA transmission line 111; a second internal CA signal may be communicated from the CA register 110 to one or more of the memory devices in the second sub-plurality of memory devices 131~135 via a second CA transmission line 113; a third internal CA signal may be communicated from the CA register 110 to one or more of the memory devices in the third sub-plurality of memory devices 151~154 via a third CA transmission line 115; and a fourth internal CA signal may be communicated from the CA register 110 to one or more of the memory devices in the fourth sub-plurality of memory devices 161~164 via a fourth CA transmission line 113.

In the illustrated embodiment of FIG. 1, the first and second CA transmission lines 111 and 113 are connected to a first module resistor unit 140 providing a first termination resistance (e.g., Rtt/2 connected to power supply voltage Vtt) to the connected CA transmission lines. The first nodule resistor unit 140 is disposed proximate the first edge 107. Similarly, the third and fourth CA transmission lines 115 and 117 are connected to a second module resistor unit 170 providing a second termination resistance (e.g., Rtt/2 connected to power supply voltage Vtt) to the connected CA transmission lines. The second module resistor unit 170 is disposed proximate the second edge 109. In the illustrated embodiment of FIG. 1 the first and second module resistor unit 140 and 170 provide the same termination resistance, but this need not be the case, and other embodiments will provide different first and second termination resistances.

When compared with certain conventional memory modules that terminate CA signal transmission lines in each row, embodiments of the inventive concept reduce the total number of required module resistor units by half, while using a termination resistor having half the resistance (e.g., Rtt/2 as compared with Rtt in the conventional examples). As a result, the memory module area occupied by the lower-resistance, termination resistor Rtt/2 may be reduced, thereby allowing an increase in the memory module area allocated to the power supply voltage Vtt.

The memory module 100 may be implemented as a registered dual in-line memory module (RDIMM). Respective memory devices 121~125, 131~135, 151~154 and 161~164 may be implemented using dual data rate 4 (DDR4) DRAMs. Further, the memory devices in each sub-plurality of memory devices (e.g., 121~125, 131~135, 151~154 and 161~164) may be said to be "in same rank", and may therefore be enabled by a common chip selection signal (not shown).

Figure 2:
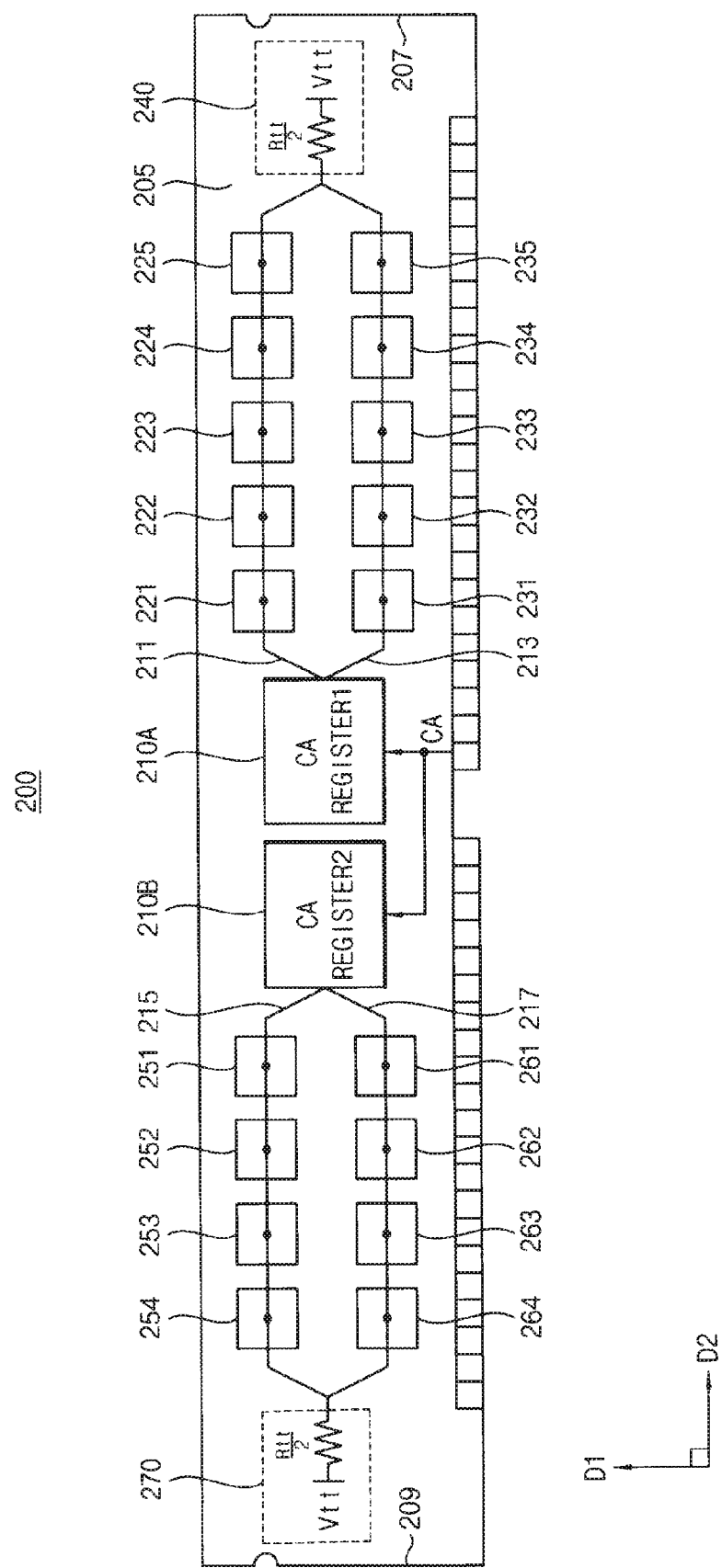

FIG. 2 is a block diagram illustrating a memory module according to another embodiment of the inventive concept.

Referring to FIG. 2, a memory module 200 includes first and second command/address (CA) registers 210A and 210B, a first sub-plurality of memory devices 221~225, a second sub-plurality of memory devices 231~235, a third sub-plurality of memory devices 251~254, and a fourth sub-plurality of memory devices 261~264, a first module resistor unit 240 and a second module resistor unit 270, collectively mounted on a circuit board 205.

As will appreciated from a comparison of the embodiments illustrated in FIGS. 1 and 2, elements labeled "1xx" in the embodiment of FIG. 1 are analogously labeled "2xx" in the embodiment of FIG. 2. This convention will be followed hereafter for subsequently described embodiments of the inventive concept. Thus, by drawing upon the cumulative discussion and in view of the illustrated analogies, those skilled in the art will understand the respective embodiments despite the fact the only material differences between the various embodiments will be described in detail hereafter.

In FIG. 2, the potential advantages of incorporating multiple CA registers within certain embodiments of the inventive concept is emphasized. Here, both first and second CA registers 210A and 210B are disposed in a central portion of the circuit board 205 with multiple sub-pluralities of memory devices (e.g., 221~225, 231~235, 251~254 and 261~264) are arranged in rows between the first and second CA registers 210A and 210B and one of the first and second edges 207 and 209.

Each one of the first and second CA registers 210A and 210B receives the external CA signal as communicated via an external CA transmission line from an external device. One or more of the memory devices in each one of the first through fourth sub-pluralities of memory devices 221~225, 231~235, 251~254 and 261~264 operates in response to an internal CA signal communicated via CA transmission lines 211, 213, 215 and 217, respectively. However, each one of the first and second CA registers 210A and 210B must operationally drive only two (2) internal CA transmission lines, and may therefore be designed with different memory device driving capabilities.

The memory module 200 may be implemented as a registered dual in-line memory module (RDIMM).

Figure 3:
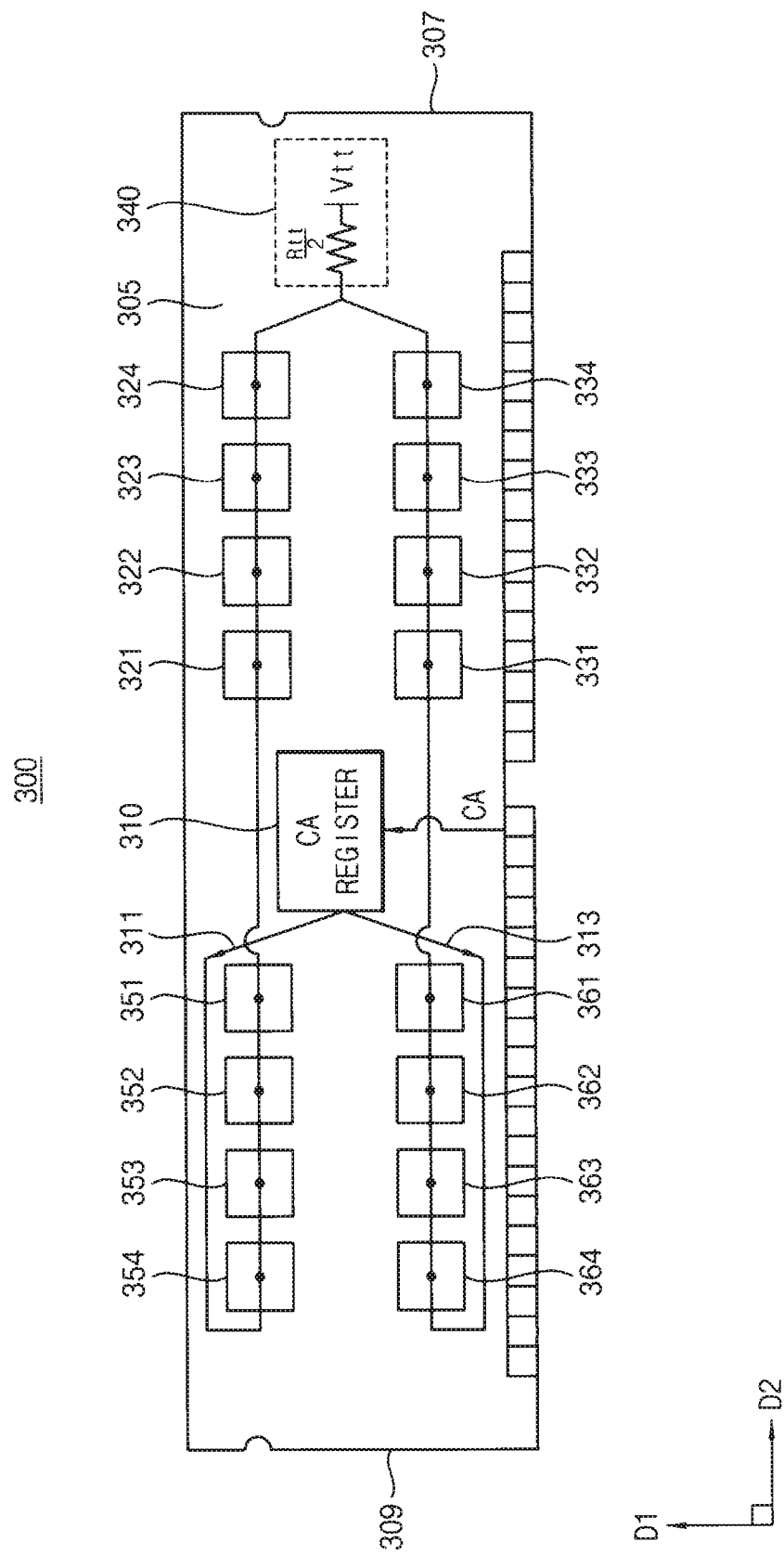

FIG. 3 is a block diagram illustrating a memory module according to still another embodiment of the inventive concept.

Referring to FIG. 3, a memory module 300 again includes a single CA register 310 mounted on a circuit board 305 in relation to first, second, third and fourth sub-pluralities of memory devices 321~324, 331~334, 351~354 and 361~364. It should be noted that while the first and second sub-pluralities of memory devices in the embodiments illustrated in FIGS. 1 and 2 included one number of memory devices (e.g., five), the third and fourth sub-pluralities of memory devices in the same embodiments included a different number of memory devices (e.g., four). In contrast, each one of the first, second, third and fourth sub-pluralities of memory devices 321~324, 331~334, 351~354 and 361~364 illustrated in FIG. 3 includes the same number (e.g., four) of memory devices.

The memory module 300 also includes a single module resistor unit 340 disposed at the first edge of the circuit board 305, and this module resistor unit 340 is used to terminate each one of the two (2) internal CA transmission lines 311 and 313. Here, it should be further noted that each row-wise arrangement of memory devices receives a corresponding, internal CA signal via a single CA transmission line. As a result, there is no need for a second module resistor unit.

The memory module 300 may be implemented as a registered dual in-line memory module (RDIMM).

Figure 4:
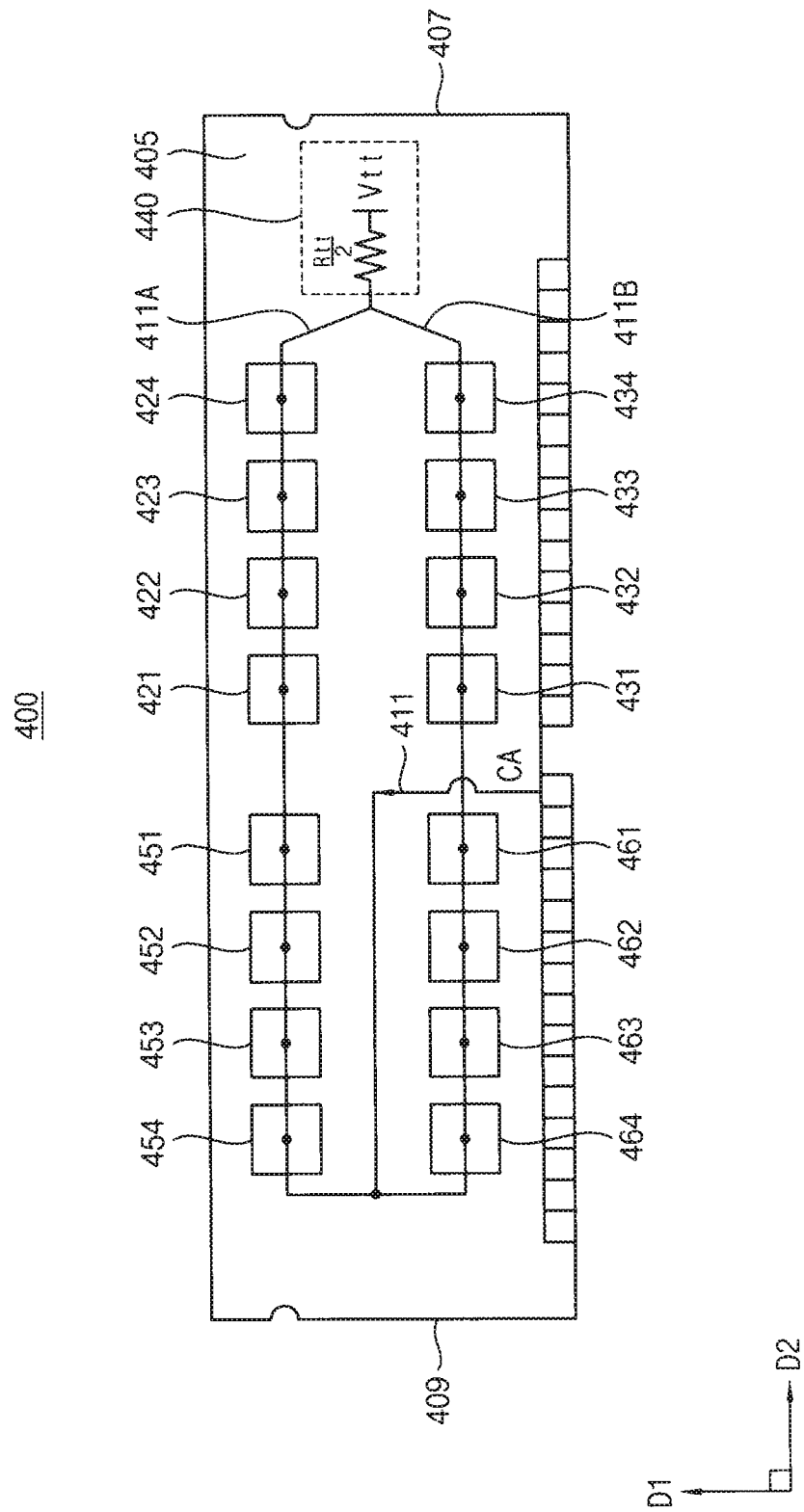

FIG. 4 is a block diagram illustrating a memory module according to still another embodiment of the inventive concept.

Referring to FIG. 4, a memory module 400 includes a plurality of memory devices arranged in respective rows on a circuit board 405. However, the embodiment of FIG. 4 omits the CA register heretofore used, and effectively extends the CA transmission line connected to the memory module 400 across the circuit 405 to connect the plurality of memory devices. For example, a first sub-plurality of memory devices, e.g., 451~454 and 421~424, includes every memory device in a first row of the memory module 400, and second sub-plurality of memory devices, e.g., 431~434 and 461~464, includes every memory device in a second row of the memory module 400.

On the memory module 400, the CA transmission line 411 is first routed from a relatively central connection point towards a second edge 409, where it is split into a number of branches (e.g., 411A and 411B) equal to the number of memory device rows on the memory module. Each of the CA transmission line branches 411A and 411B than substantially traverses the length of the circuit board 405 towards a first edge 407 until commonly terminated at a module resistor unit 440 disposed proximate the first edge 407.

When compared with certain conventional memory modules terminating the CA signal transmission line for each row in a dedicated module resistor unit, the embodiment of FIG. 4 reduces the required number of module resistor units by 75%, while the resistance of the termination resistor Rtt/2 is reduced by half. Here, each CA transmission line branch 411A and 411B is row-wise coupled to constituent memory devices using a fly-by, daisy-chain topology.

The memory module 400 may be implemented as an unregistered dual in-line memory module (UDIMM).

Figure 5:
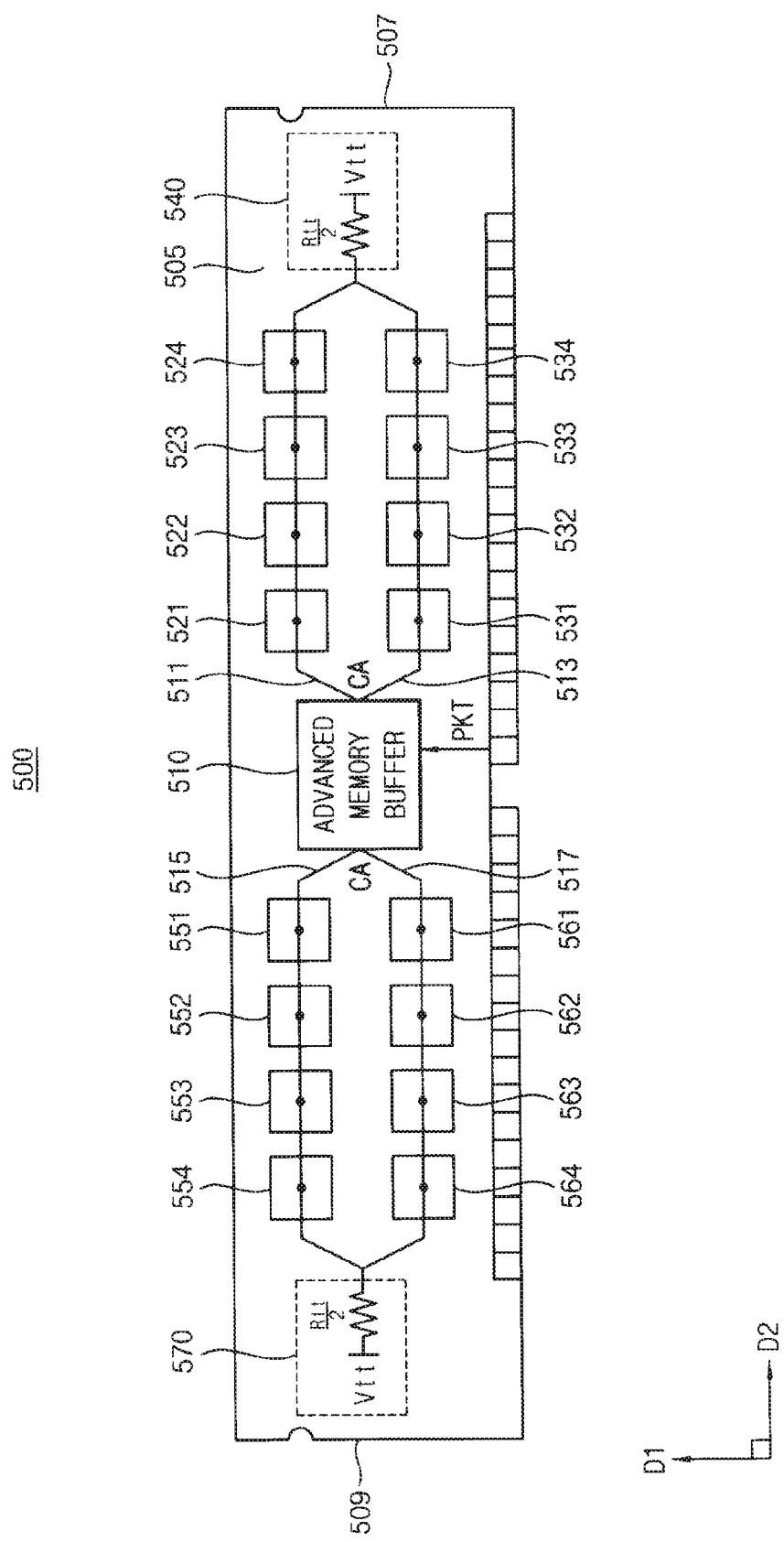

FIG. 5 is a block diagram illustrating a memory module according to still another embodiment of the inventive concept.

Referring to FIG. 5, a memory module 500 includes an advanced memory buffer (or "hub") 510 in place of the less capable components (e.g., CA register 110 of FIG. 1) described in previous embodiments.

In many different configurations, the hub 510 will be capable of receiving command packet(s) (PKT) from an external device (e.g., a memory controller or processor) in place of the external CA signal. As will be appreciated by those skilled in the art, command packets are essentially a collection of digital data capable of communicating address and control information. Command packets may be defined and communicated using one or more of many different protocols.

Once received by the hub 510, command packet(s) may be decoded or converted into one or more internal CA signals before being communicated to one or more memory devices among one or more sub-pluralities of memory devices (e.g., 521~524, 531~134, 551~554 and 561~564) via an appropriate internal CA transmission lines (e.g., 511, 513, 515 and 517).

Here again, the hub 510 is coupled to memory devices 521~524 and 531~534 in one fly-by ring topology, and is coupled to memory devices 551~554 and 561~564 in another fly-by ring topology.

The memory module 500 may be implemented as a fully-buffered dual in-line memory module (FBDIMM).

Figure 6:
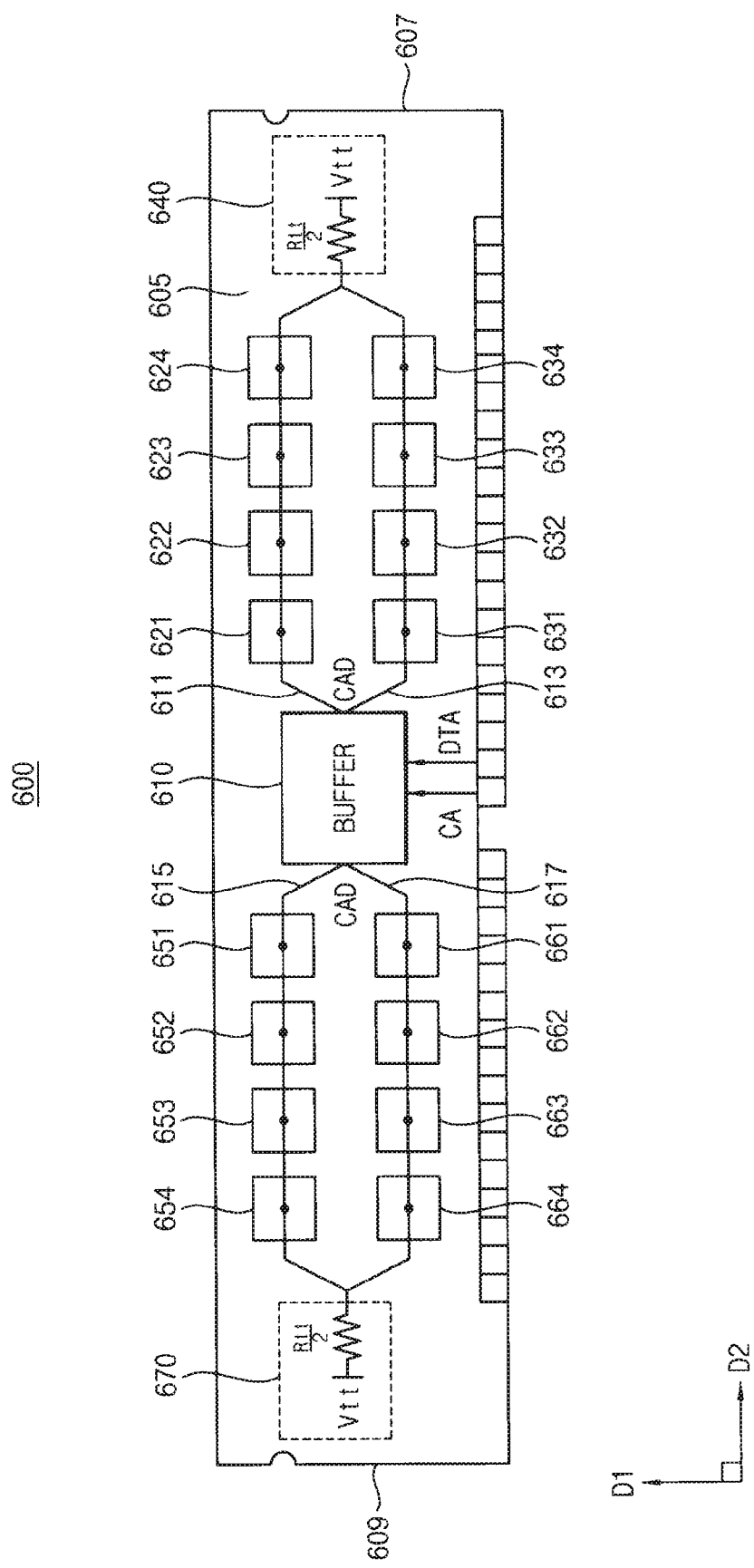

FIG. 6 is a block diagram illustrating a memory module according to still another embodiment of the inventive concept.

Referring to FIG. 6, a memory module 600 includes a buffer 610 in place of the components (e.g., CA register 110 of FIG. 1) described in previous embodiments. Of note, the buffer 610 receives not only the command/address (CA) information provided by one or more external CA transmission line(s), but also data information from one or more external data (DTA) transmission lines. The external CA signal and DTA signals may originate at the same external device or different external devices.

In response to the CA information and data information, the buffer 610 may generate a combined command/address/data (CAD) signal capable of being communicated to one or more of first through fourth sub-pluralities of memory devices (e.g., 621~624, 631~634, 651~654 and 661~664) via respective internal CAD transmission lines 611, 613, 615 and 617. In the illustrated embodiment of FIG. 6 it is assumed that the internal CAD transmission lines are terminated in a manner similar to that described in relation to the termination of the internal CA transmission lines of FIG. 1.

The memory module 600 may be implemented as a load-reduced dual in-line memory module (FBDIMM).

Figure 7:
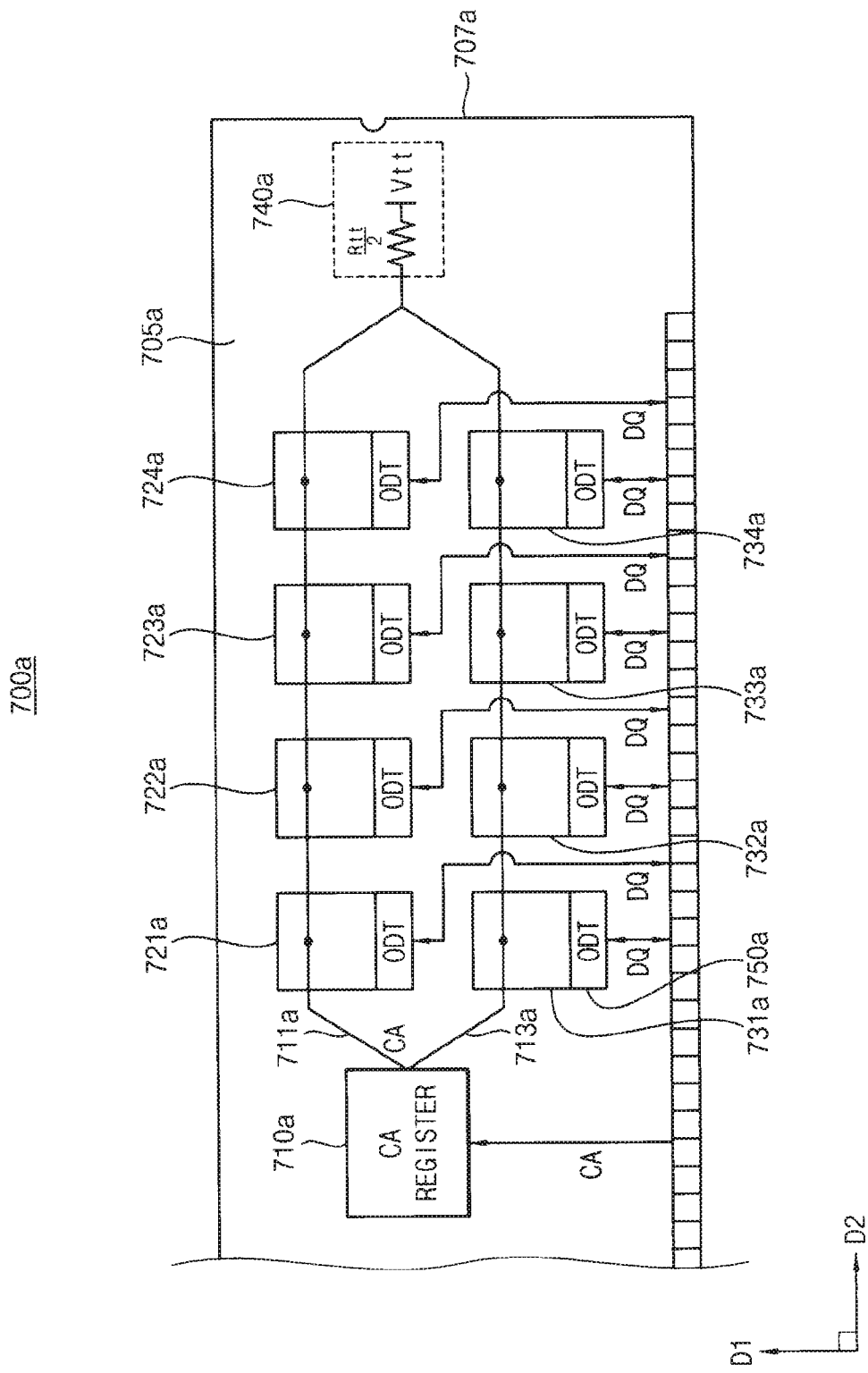

FIG. 7 is a block diagram illustrating a relevant portion of a memory module according to still another embodiment of the inventive concept.

Referring to FIG. 7, a memory module 700a includes a command/address (CA) register 710a, a plurality of memory devices 721a~724a and 731a~734a and a module resistor unit 740a collectively mounted on a circuit board 705a.

The circuit board 705a extends in the second direction D2 between a first edge 707a and a second edge (not shown). The CA register 710a is arranged in a central portion of the circuit board 705a, and the memory devices 721a~724a and 731a~734a are arranged in a plurality of rows between the CA register 710a and the first edge 707a.

The CA register 710a receives an externally supplied command/address (CA) signal. Further, each one of the plurality of memory devices 721a~724a and 731a~734a is configured to receive corresponding data via respective data transmission lines (DQ). The CA register 710a provides a first internal CA signal to the memory devices 721a~724a via a first CA transmission line 711a, and provides a second CA signal to the memory devices 731a~734a via a second CA transmission line 713a. Here, the first and second internal CA signals may contain the same CA information, or not. The first and second CA transmission lines 711a and 713a are commonly terminated in a module resistor unit 740a including a termination resistance Rtt/2 and being disposed proximate the first edge 707a.

As before, the module resistor unit 740a includes a termination resistor Rtt/2 and a power supply voltage Vtt. The CA register 710a is coupled to the memory devices 721a~724a and 731a~734a using a fly-by ring topology.

In the illustrated embodiment of FIG. 7, it is further assumed that each one of the plurality of memory devices 721a~724a and 731a~734a includes an on-die termination (ODT) circuit 750a properly terminating the corresponding data transmission line (DQ). Each on-die termination circuit 750a may be implemented as a single-tap termination or center-tap termination, for example.

The memory module 700a may be implemented as a registered dual in-line memory module (RDIMM). In addition, the memory devices 721a~724a and 731a~734a may be implemented as dual data rate 4 (DDR4) DRAMs. And as described above, the plurality of memory devices 721a~724a and 731a~734a may arranged in assigned ranks and readily enabled using a common chip selection signal.

Figure 8A:
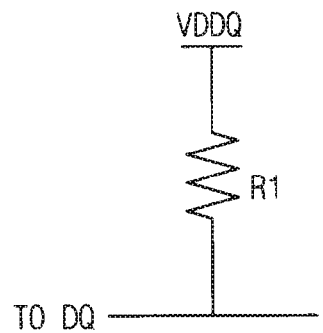
FIG. 8A is a circuit diagram of an on-die termination circuit that may be used in FIG. 7 according to an embodiment of the inventive concept.

FIG. 8A illustrates one example of the on-die termination (ODT) circuit that may be used in the embodiment of FIG. 7.

Referring to FIG. 8A, a single-tap termination, on-die termination (ODT) circuit 751a includes a resistor R1 connected between a power supply voltage (VDDQ) and a data transmission line (DQ). With this configuration, the on-die termination circuit 751a may provide on-die termination resistance of R1 to the data transmission line DQ.

Figure 8B:
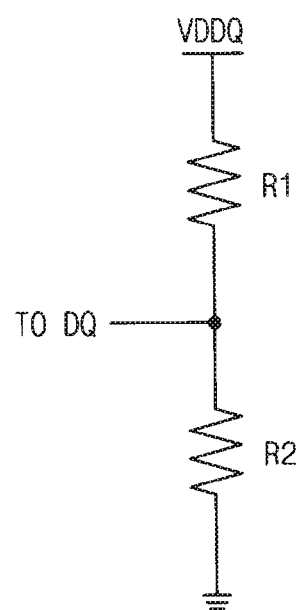
FIG. 8B is a circuit diagram of an on-die termination circuit that may be used in FIG. 7 according to an embodiment of the inventive concept.

FIG. 8B illustrates another example of an on-die termination (ODT) circuit that may be used in the embodiment of FIG. 7.

Referring to FIG. 8B, a center-tap termination on-die termination (ODT) circuit 751b includes resistors R1 and R2 connected between a power supply voltage (VDDQ) and ground voltage. With this configuration, the on-die termination circuit 751b provides on-die termination resistance of [R1*R2/(R1+R2)] to the data transmission line DQ.

Figure 9:
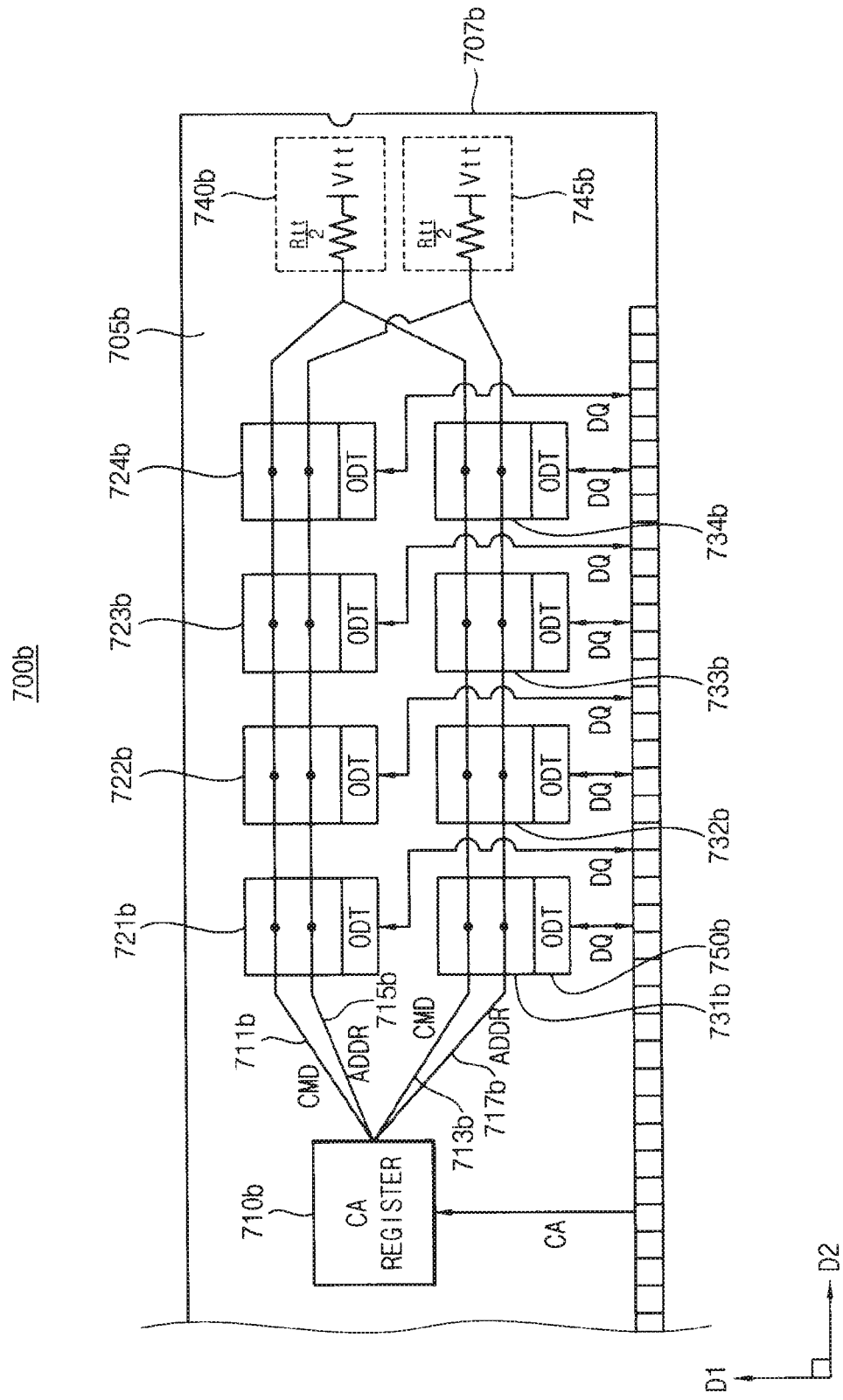
FIG. 9, FIG. 10, and FIG. 11 are each a block diagram respectively illustrating a portion of a memory module according to certain embodiments of the inventive concept.

FIG. 9 is a block diagram illustrating a relevant portion of a memory module according to still another embodiment of the inventive concept.

Referring to FIG. 9, a memory module 700b includes a command/address (CA) register 710b, a plurality of memory devices 721b~724b and 731b~734b and a first and second module resistor units 740b and 745b mounted on a circuit board 705b.

The circuit board 705b extends between a first edge 707b and a second edge (not shown). The CA register 710b is arranged in a central portion of the circuit board 705b, and the memory devices 721b~724b and 731b~734b are arranged in a plurality of rows between the CA register 710b and the first edge 707b.

The CA register 710b receives an externally provided CA signal from a CA transmission line connected to an external device. Each of memory devices 721b~724b and 731b~734b receives corresponding data via a corresponding data transmission line (DQ). The CA register 710b provides separate first command (CMD) and first address (ADDR) signals to the first sub-plurality of memory devices 721b~724b via a dedicated first internal command transmission line 711b and a dedicated first internal address transmission line 715b, respectively. Similarly, the CA register 710b provides separate second command (CMD) and second address (ADDR) signals to the second sub-plurality of memory devices 731b~734b via a dedicated second internal command transmission line 713b and a dedicated second address transmission line 717b, respectively.

The first and second command CMD transmission lines 711b and 713b are commonly terminated in the first module resistor unit 740b, and the first and second address transmission lines 715b and 717b are commonly terminated in the second module resistor unit 745b. Here again, both of the first and second module resistor units 740b and 745b are assumed to provide a termination resistance of Rtt/2 connected to a power supply voltage Vtt. In this manner, the CA command/address register 710b is coupled to the memory devices 721b~724b and 731b~734b via a fly-by ring topology through respective command transmission lines 711b and 713b and address transmission lines 715b and 717b.

In addition, each of the memory devices 721b~724b and 731b~734b is assumed to include an on-die termination (ODT) circuit 750b providing an on-die termination resistance proper to the corresponding data transmission line.

The memory module 700b may be implemented as a registered dual in-line memory module (RDIMM).

It should be further noted that the on-die termination circuit 750a, whether implemented as a single-tap termination or a center-tap termination, may be employed in the memory devices of FIGS. 1 through 4. In addition, separation of a command transmission line from an address transmission line may be employed in the memory modules of FIGS. 1 through 7.

Figure 10:
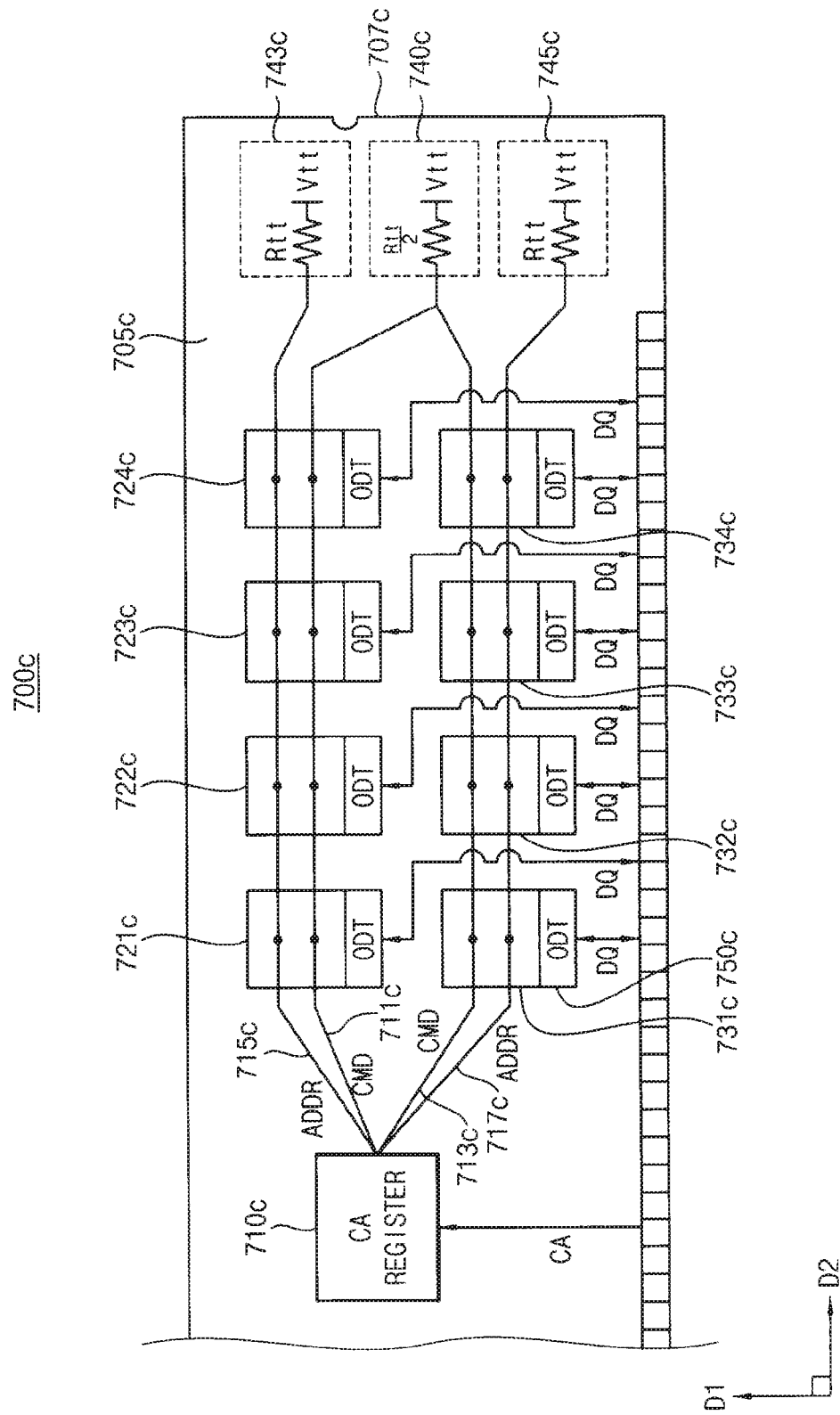

FIG. 10 is a block diagram illustrating a relevant portion of a memory module according to still another embodiment of the inventive concept.

Referring to FIG. 10, a memory module 700c includes a command/address (CA) register 710c, a plurality of memory devices 721c~724c and 731c~734c and module resistor units 740c, 743c and 745c collectively mounted on a circuit board 705c.

Here, the subject embodiment departs from the previous example of FIG. 9 in that each one of the internal address transmission lines 715c and 717c is separately terminated in a dedicated module resistor unit 743c and 745c. Such separate and dedicated signal termination tends to further quiet each address transmission line.

Figure 11:
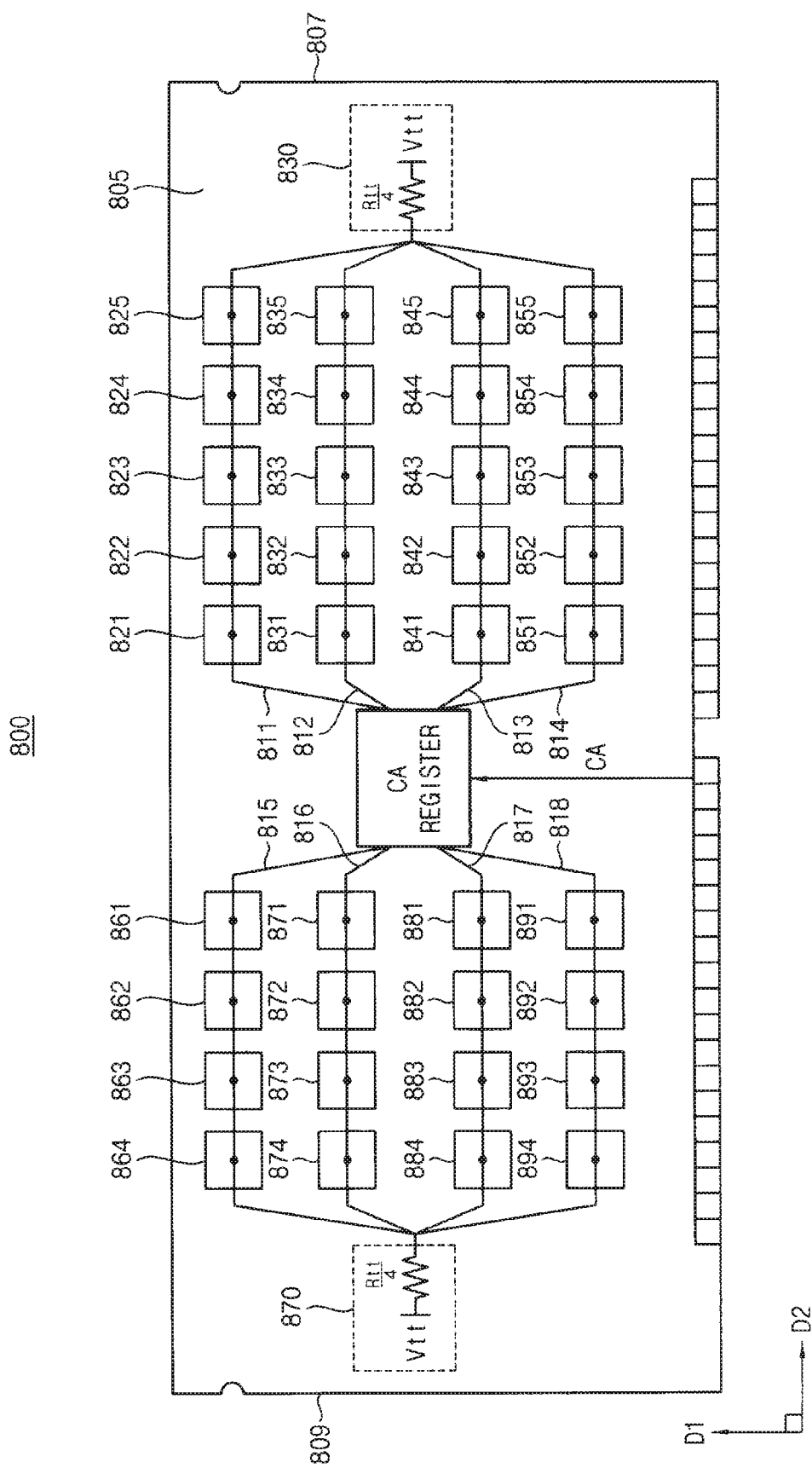

FIG. 11 is a block diagram illustrating a memory module according to still another embodiment of the inventive concept.

Referring to FIG. 11, a memory module 800 includes a command/address (CA) register 810, a plurality of memory devices 821~825, 831~835, 841~845, 851~855, 861~864, 871~874, 881~884 and 891~894 and module resistor units 830 and 870 collectively mounted on a circuit board 805.

The circuit board 805 extends along a second direction D2 between first and second edges 807 and 809 which run in a first direction D1 which is perpendicular to the second direction D2. The CA register 810 is arranged in a central portion of the circuit board 805, and the memory devices 821~825, 831~835, 841~845, 851~855, 861~864, 871~874, 881~884 and 891~894 are arranged in a plurality of rows in the second direction D2 between the CA register 810 and one of the first and second edges 807 and 809.

The CA register 810 receives a command/address signal CA through a command/address transmission line from an external device. Each of memory devices 821~825, 831~835, 841~845, 851~855, 861~864, 871~874, 881~884 and 891~894 may receive corresponding data through corresponding data transmission line. The CA register 810 provides command/address signal to the memory devices 821~825 through a command/address transmission line 811, provides command/address signal to the memory devices 831~835 through a command/address transmission line 812, provides command/address signal to the memory devices 841~845 through a command/address transmission line 813, provides command/address signal to the memory devices 851~855 through a command/address transmission line 814, provides command/address signal to the memory devices 861~864 through a command/address transmission line 815, provides command/address signal to the memory devices 871~874 through a command/address transmission line 816, provides command/address signal to the memory devices 881~884 through a command/address transmission line 817 and provides command/address signal to the memory devices 891~894 through a command/address transmission line 818. The command/address transmission lines 811, 812, 813 and 814 are commonly connected to a module resistor unit 830 which provides termination resistance of Rtt/4 and is arranged adjacently to the first edge 807, and the command/address transmission lines 815, 816, 817 and 818 are commonly connected to a module resistor unit 870 which provides termination resistance of Rtt/4 and is arranged adjacently to the second edge 809.

Each of the module resistor units 830 and 870 includes a termination resistor Rtt/4 and a power supply voltage Vtt. When compared with certain conventional memory modules in which the memory devices in each row are separately terminated, the number of the module resistor units 830 and 870 is reduced by 75%, and the resistance of the termination resistor Rtt/4 is also reduced by 25%. Therefore, the area occupied by the termination resistor Rtt/4 may be reduced, and area allocated to the power supply voltage Vtt may be increased.

The CA register 810 is coupled to the memory devices 821~825, 831~835, 841~845 and 851~855 in a fly-by ring topology. In addition, the CA register 810 is coupled to the memory devices 861~864, 871~874, 881~884 and 891~894 in a fly-by ring topology. In addition, the memory devices 821~825, 831~835, 841~845, 851~855, 861~864, 871~874, 881~884 and 891~894 may be assigned a rank to enable actuation in response to a same chip selection signal.

Figure 12:
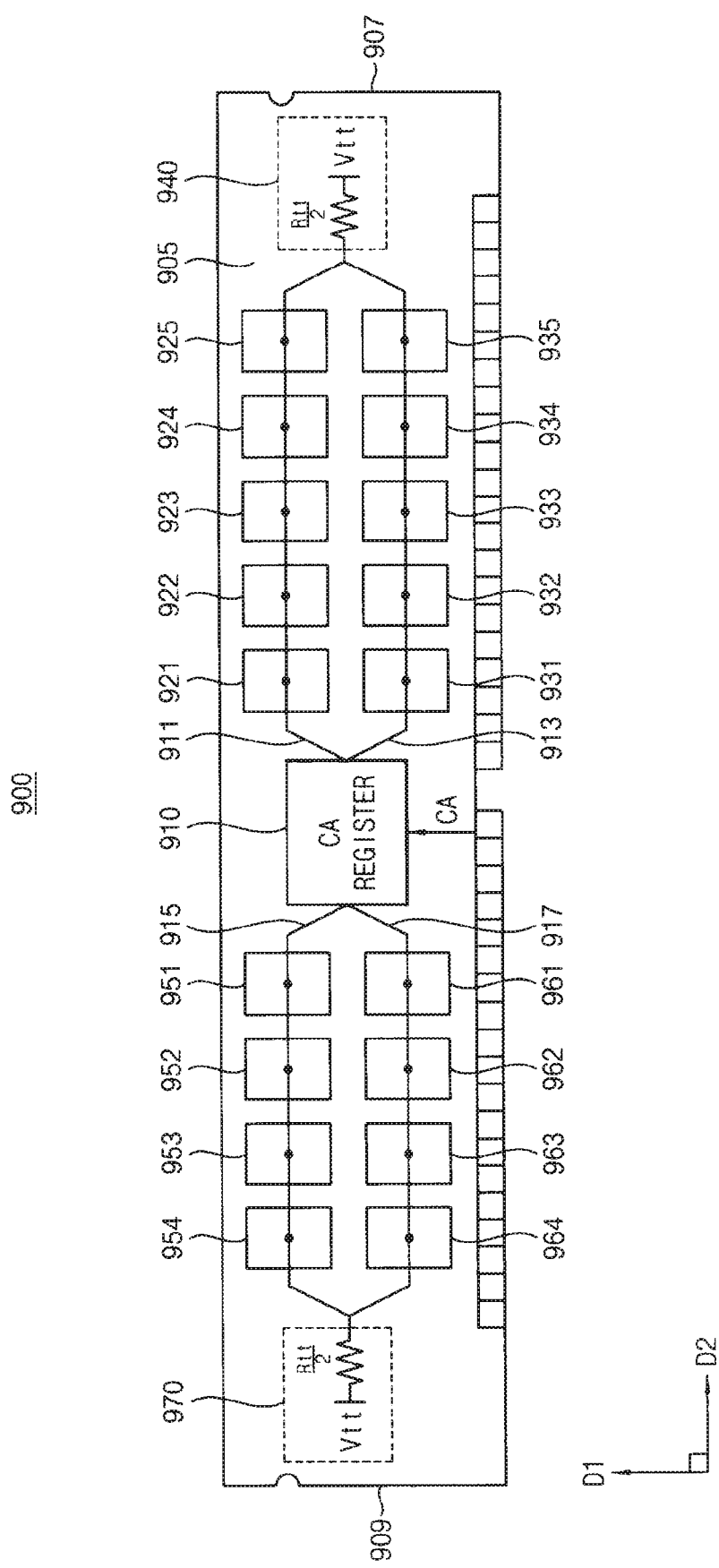
FIG. 12 is a block diagram illustrating a memory module according to yet another embodiment of the inventive concept.

FIG. 12 is a block diagram illustrating a memory module according to still another embodiment of the inventive concept.

Referring to FIG. 12, a memory module 900 includes a command/address (CA) register 910, a plurality of memory devices, each having a substantially rectangular shape, 921~925, 931~935, 951~954 and 961~964, and module resistor units 940 and 970, collectively mounted on a circuit board 905.

The circuit board 905 extends along a second direction D2 between first and second edges 907 and 909 which run in a first direction D1 which is perpendicular to the second direction D2. The CA register 910 is arranged in a central portion of the circuit board 905, and the memory devices 921~925, 931~935, 951~954 and 961~964 are arranged in a plurality of rows between the CA register 910 and the first and second edges 907 and 909 in the second direction D2. Some of the memory devices 921~925 and 931~935 may be ECC memory devices.

The CA register 910 receives command/address signal CA through a command/address transmission line from an external memory controller. Each of memory devices 921~925, 931~935, 951~954 and 961~964 may receive corresponding data through corresponding data transmission line. The CA register 910 provides command/address signal to the memory devices 921~925 through a CA transmission line 911, provides CA signal to the memory devices 931~935 through a CA transmission line 913, provides command/address signal to the memory devices 951~954 through a CA transmission line 915 and provides CA signal to the memory devices 961~964 through a CA transmission line 917.

The CA transmission lines 911 and 913 are commonly connected to a module resistor unit 940 which provides termination resistance of Rtt/2 and is arranged adjacently to the first edge 907, and the CA transmission lines 915 and 917 are commonly connected to a module resistor unit 970 which provides termination resistance of Rtt/2 and is arranged adjacently to the second edge 909.

Each of the module resistor units 940 and 970 includes a termination resistor Rtt/2 and a power supply voltage Vtt. When compared with certain conventional memory modules that separately terminate memory devices in each row, the number of the module resistor units 940 and 970 is reduced by a half, and a resistance of the termination resistor Rtt/2 is also reduced by a half. Therefore, as the area occupied by the termination resistor Rtt/2 may be reduced, and area allocated to the power supply voltage Vtt may be increased. The CA register 910 is coupled to the memory devices 921~925 and 931~935 in a fly-by ring topology. In addition, the CA register 910 is coupled to the memory devices 951~954 and 961~964 in a fly-by ring topology.

The memory module 900 may be implemented as a registered dual in-line memory module (RDIMM). In addition, the memory devices 921~925, 931~935, 951~954 and 961~964 are implemented with dual data rate4 (DDR4) DRAMs, and the memory devices 921~925, 931~935, 951~954 and 961~964 may be assigned a rank to be enabled in response to a common chip selection signal.

Figure 13:
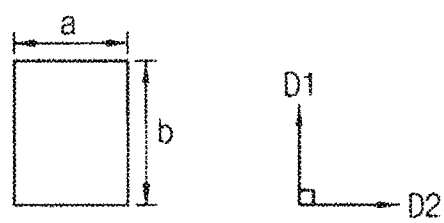
FIG. 13 further illustrates one of the memory devices of the memory module of FIG. 12.

FIG. 13 further illustrates one of the memory devices of FIG. 12. Referring to FIG. 13, a rectangular-shaped memory device 921 has a first side "a" that extends in the second direction D2 and a second side "b" that extends in the first direction D1, wherein the second side "b" is longer than the first side "a. Referring again to FIG. 12, the memory devices 921~925, 931~935, 951~954 and 961~964 are arranged in a plurality of rows between the CA register 910 and the first and second edges 907 and 909 with the first side "a" being along the second direction D2.

Figure 14:
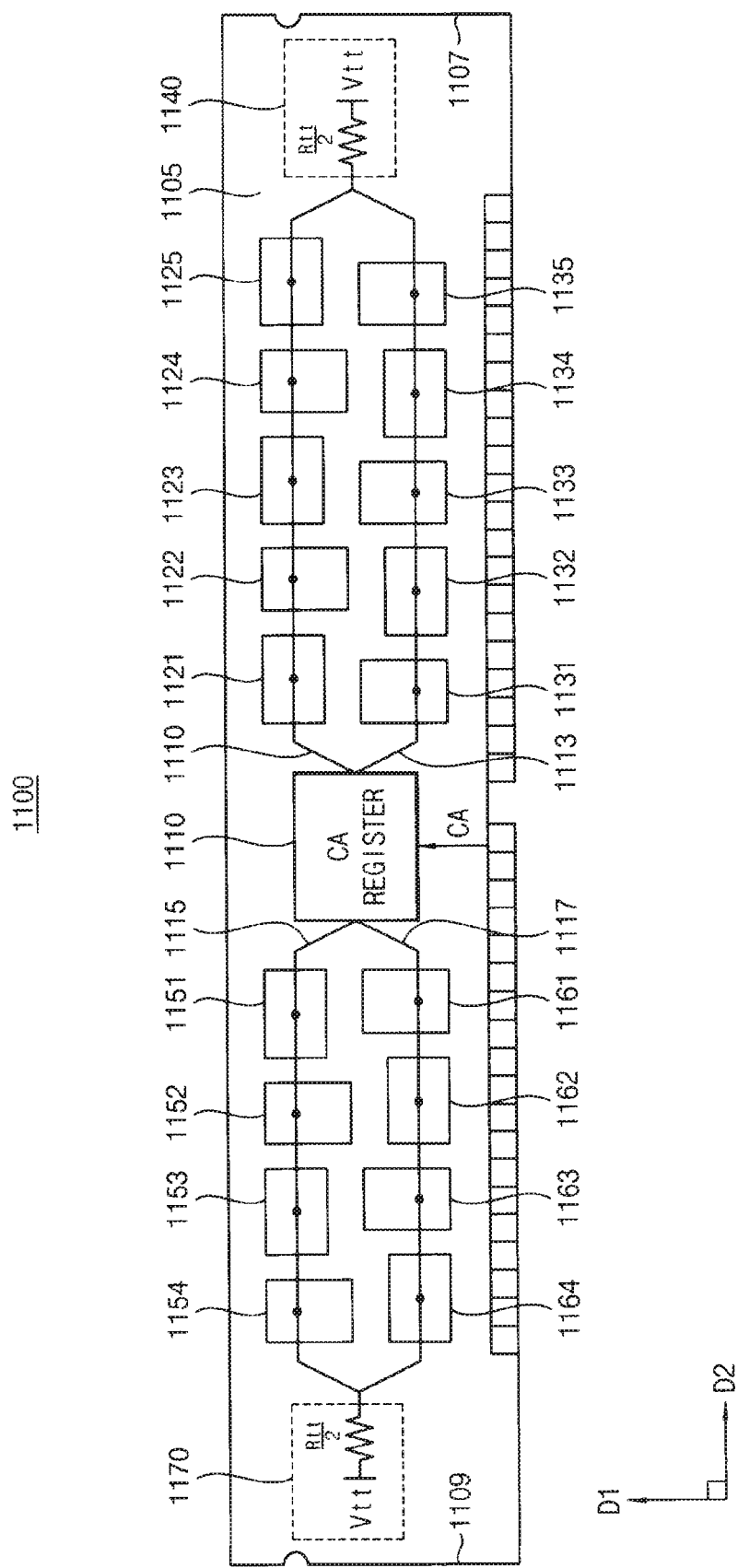
FIG. 14 is a block diagram illustrating a memory module according to still another embodiment of the inventive concept.

FIG. 14 is a block diagram illustrating a memory module according to still another embodiment of the inventive concept.

Referring to FIG. 14, a memory module 1100 includes a command/address (CA) register 1110, a plurality of substantially rectangular-shaped memory devices 1121~1125, 1131~1135, 1151~1154 and 1161~1164, and module resistor units 1140 and 1170, collectively mounted on a circuit board 1105.

The circuit board 1105 extends along a second direction D2 between first and second edges 1107 and 1109 which run in a first direction D1 which is perpendicular to the second direction D2. The at least one CA register 1110 is arranged in a central portion of the circuit board 1105, and the rectangular-shaped memory devices memory devices 1121~1125, 1131~1135, 1151~1154 and 1161~1164 are arranged in a plurality of rows between the CA register 1110 and the first and second edges 1107 and 1109 in the second direction D2. Some of the memory devices 1121~1125 and 1131~1135 may be ECC memory devices.

The CA register 1110 receives externally provided CA signals via a CA transmission line connected to an external device. Each of memory devices 1121~1125, 1131~1135, 1151~1154 and 1161~1164 may receive corresponding data through corresponding data transmission line. The CA register 1110 provides a first internal CA address signal to the first sub-plurality of memory devices 1121~1125 via a first internal CA transmission line 1111; provides a second internal CA signal to the second sub-plurality of memory devices 1131~1135 via a second internal CA transmission line 1113; provides a third internal CA signal to the third sub-plurality of memory devices 1151~1154 via a third internal CA transmission line 1115; and provides a fourth internal CA signal to the fourth sub-plurality of memory devices 1161~1164 via a fourth internal CA transmission line 1117.

The first and second internal CA lines 1111 and 1113 are commonly connected to the first module resistor unit 1140, and the third and fourth internal CA transmission lines 1115 and 1117 are commonly connected to the second module resistor unit 1170. Each of the module resistor units 1140 and 1170 includes a termination resistor Rtt/2 connected to a power supply voltage Vtt. Here again, the CA register 1110 is coupled to the memory devices 1121~1125 and 1131~1135 in one fly-by ring topology, and is coupled to the memory devices 1151~1154 and 1161~1164 in another fly-by ring topology.

The memory module 1100 may be implemented as a registered dual in-line memory module (RDIMM).

Figure 15:
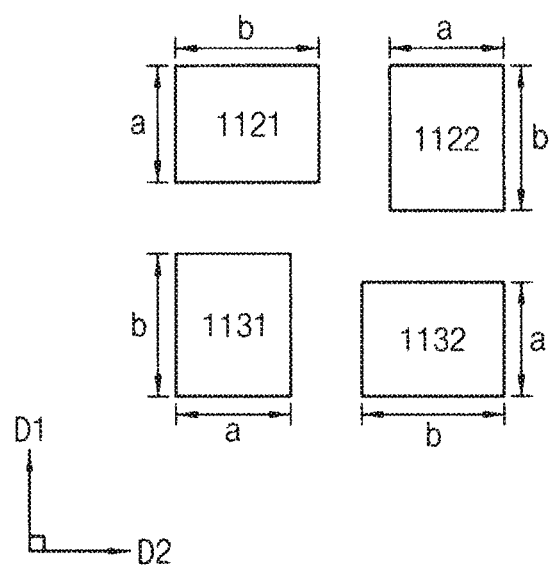
FIG. 15 illustrates an arrangement of four (4) adjacent memory devices of the memory module of FIG. 14.

FIG. 15 further illustrates one particular arrangement of four (4) adjacent memory devices that may be incorporated within the memory module of FIG. 14.

Referring to FIG. 15, each of the rectangular-shaped memory devices 1121, 1122, 1131 and 1132 has a first side "a" and a second side "b" longer than the first side "a". Each pair of "row-adjacent" memory devices (e.g., memory devices 1121 and 1122, or memory devices 1131 and 1132) is arranged in an opposite-side oriented relationship relative to a given direction (D1 or D2). Thus, one memory device in each pair of row-adjacent memory devices has side "a" oriented along the given direction, while the other memory device in the pair has side "b" oriented along the given direction.

Figure 16:
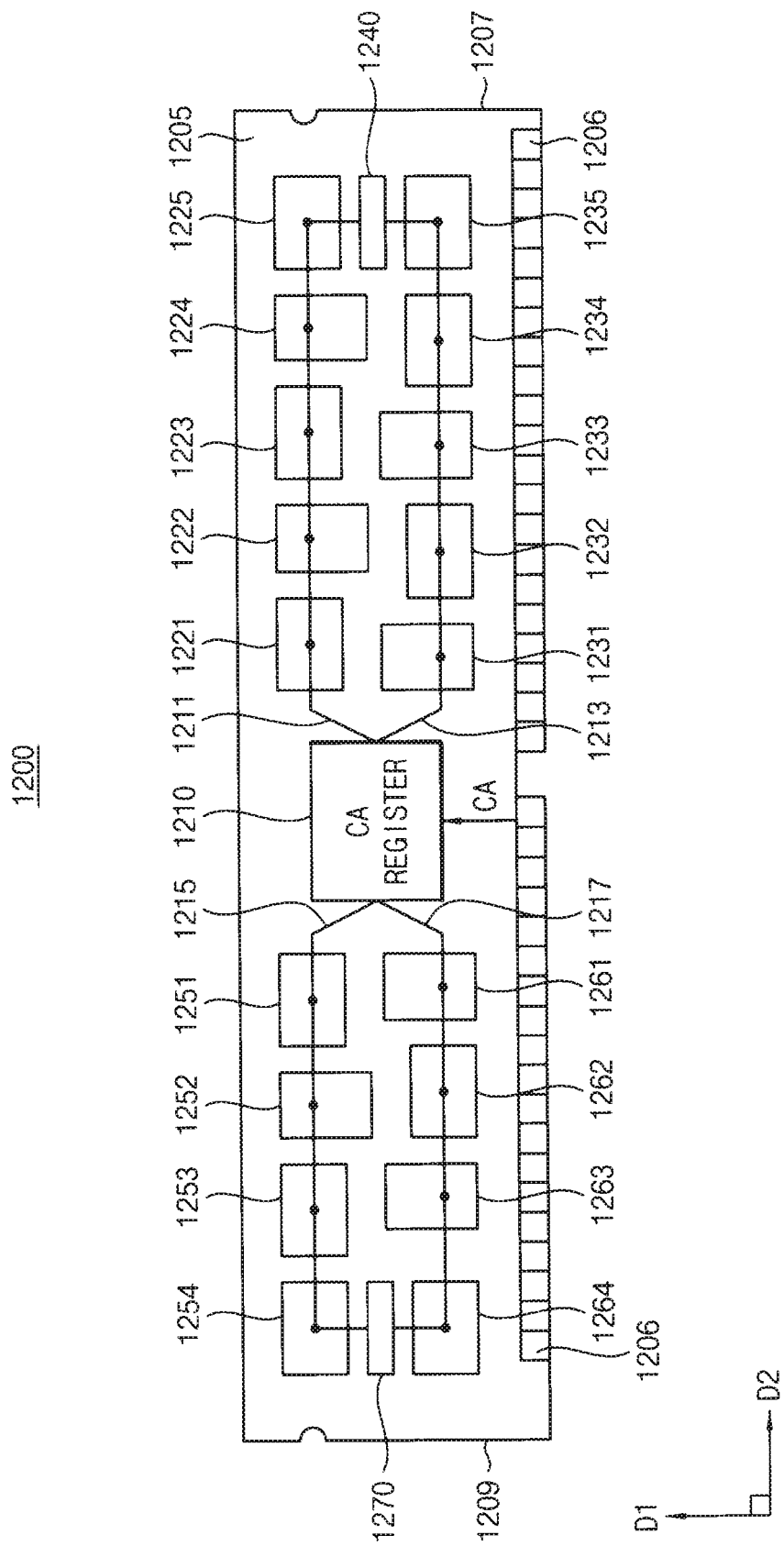
FIG. 16 is a block diagram illustrating a memory module according to still another embodiment of the inventive concept.

FIG. 16 is a block diagram illustrating a memory module according to still another embodiment of the inventive concept.

Referring to FIG. 16, a memory module 1200 includes a command/address (CA) register 1210, a plurality of rectangular-shaped memory devices 1221~1225, 1231~1235, 1251~1254 and 1261~1264, and module resistor units 1240 and 1270, collectively mounted on a circuit board 1205.

As compared with the embodiment of FIG. 14, layout dispositions of the module resistor units 1240 and 1270 relative to the plurality of memory devices is more particular. In the embodiment of FIG. 14 and previous embodiments, it is generally assumed that one or more module resistor units is disposed as close to an edge of a mounting circuit board as is practical. This "edge-proximate" disposition of each module resistor unit essentially placed each module resistor unit between outermost memory devices in adjacent rows and the corresponding edge. However, in the embodiment of FIG. 16, each module resistor unit 1240 and 1270 is disposed between outermost memory devices in adjacent rows (e.g., 1225 and 1235 or 1254 and 1264). In this manner, the rows of memory devices may be extended further towards a corresponding edge (e.g., 1207 and 1209), and the components implementing each module resistor unit 1240 and 1270 is moved further away from the corresponding edge to reduce the likelihood of user contact together with the commensurate damage.

Figure 17:
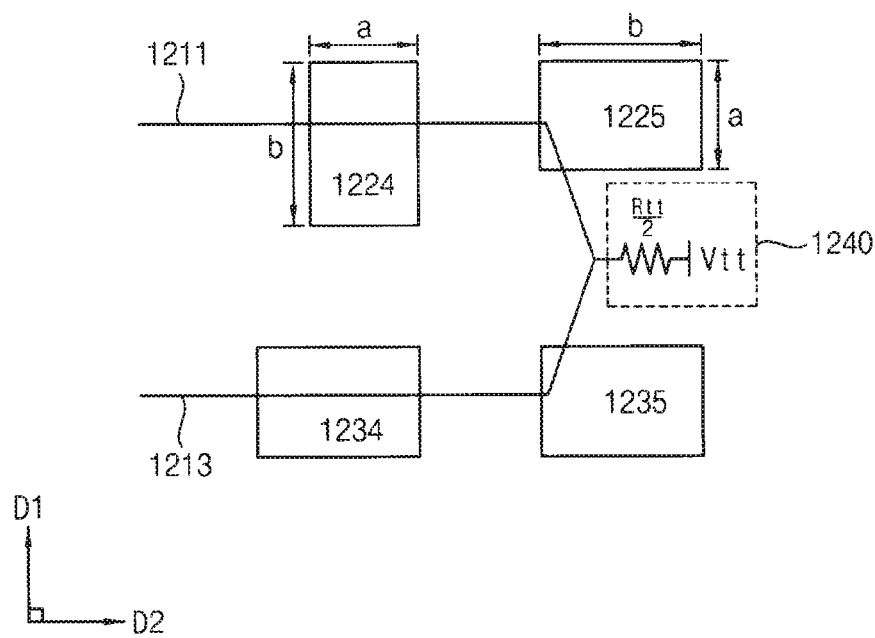
FIG. 17 illustrates an arrangement of four (4) adjacent memory devices and the module resistor unit of the memory module of FIG. 16.

FIG. 17 illustrates an arrangement of four (4) adjacent (and outermost in row) memory devices with a corresponding module resistor unit that may be incorporated into the memory module of FIG. 16.

In FIG. 17, the four (4) adjacent memory devices 1224, 1225, 1234 and 1235 are arranged proximate the first edge 1207. Each of the rectangular-shaped memory devices 1224, 1225, 1234 and 1235 has the described first side "a" and second side "b". The constituent rows are adjacent in the D1 direction. The upper row connected to the first internal CA transmission line 1211 includes memory devices 1224 and 1225 arranged in the "opposite-side oriented relationship" along the D2 direction, wherein the lower row connected to the second internal CA transmission line 1213 includes memory devices 1234 and 1235 arranged in a "same-side oriented relationship" (i.e., both memory devices orient the same side "b" in the D2 direction).

This configuration generally provides more area between the two outermost memory devices in the adjacent rows (1225 and 1235) for the disposition of the first module resistor unit 1270.

Figure 18:
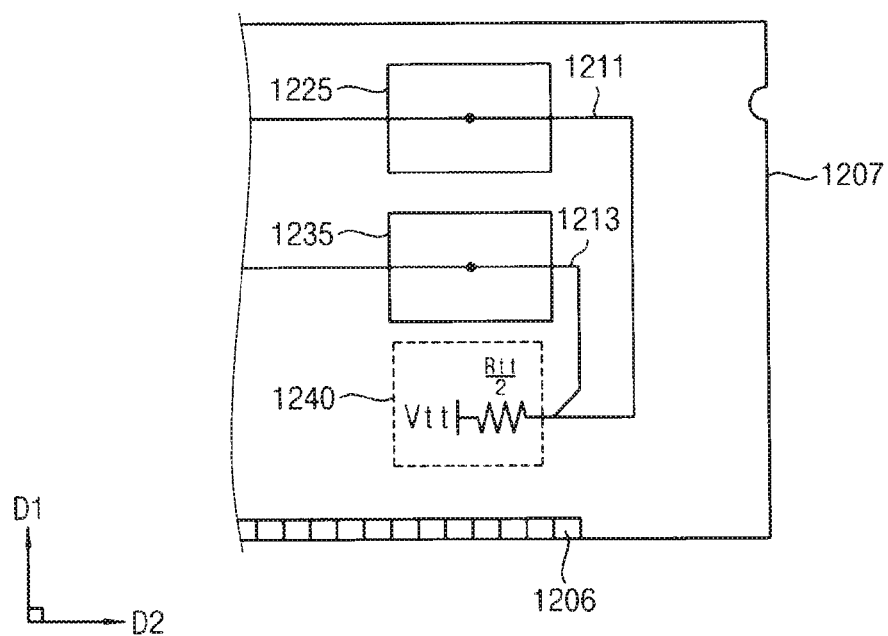
FIG. 18 illustrates an arrangement of first memory devices and the module resistor unit of the memory module of FIG. 16.

In contrast, FIG. 18 illustrates another arrangement of row-outermost memory devices and an associated module resistor unit mounted proximate an edge of a memory module according to certain embodiments of the inventive concept.

Here, drawings from the discussion of FIGS. 14 and 16, the first module resistor unit 1240 is disposed below (or above) the row-outermost memory devices while being aligned in a given direction (e.g., direction D1) with the row-outermost memory devices.

In this manner, the relevant rows may be extended towards the edge if desired, or the module resistor may be moved further away from the edge to reduce user handling damage. Of course, the disposition of the module resistor unit 1240 above or below the adjacent rows will tend to expand the size of the circuit board 1205 in the D1 direction.

Also illustrated in FIG. 18 (and FIG. 16) is the concept of a module tap 1206 disposed on the circuit board 1205. Each outermost memory device (e.g., 1225 and 1235) in the respective rows may be said to be "outermost" due to its most closely proximate disposition to a module tap 1206, as compared with other memory devices in the same row.

Figure 19:
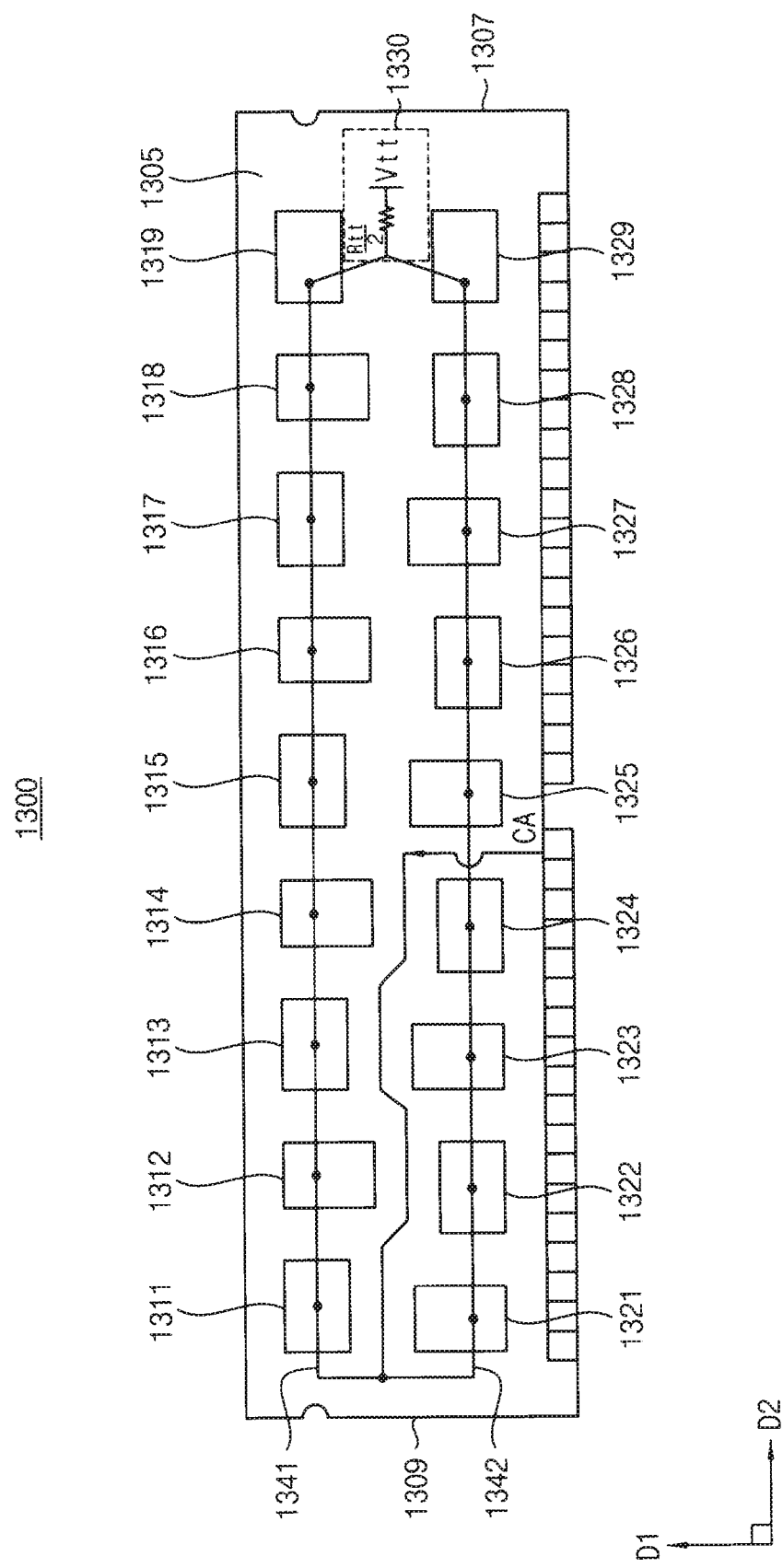
FIG. 19 is a block diagram illustrating a memory module according to still another embodiment of the inventive concept.

FIG. 19 is a block diagram illustrating a memory module according to still another embodiment of the inventive concept.

Referring to FIG. 19, a memory module 1300 includes a plurality of rectangular-shaped memory devices 1311~1319 and 1321~1329, and a module resistor unit 1330 mounted on a circuit board 1305.

Here, the plurality of substantially rectangular-shaped memory devices 1311~1319 and 1321~1329 is arranged in a plurality of rows between the first and second edges 1307 and 1309 in the same manner as described in relation to FIGS. 16 and 17. Yet, the centrally located command/address register is omitted in the manner of the embodiment of FIG. 4.

Figure 20:
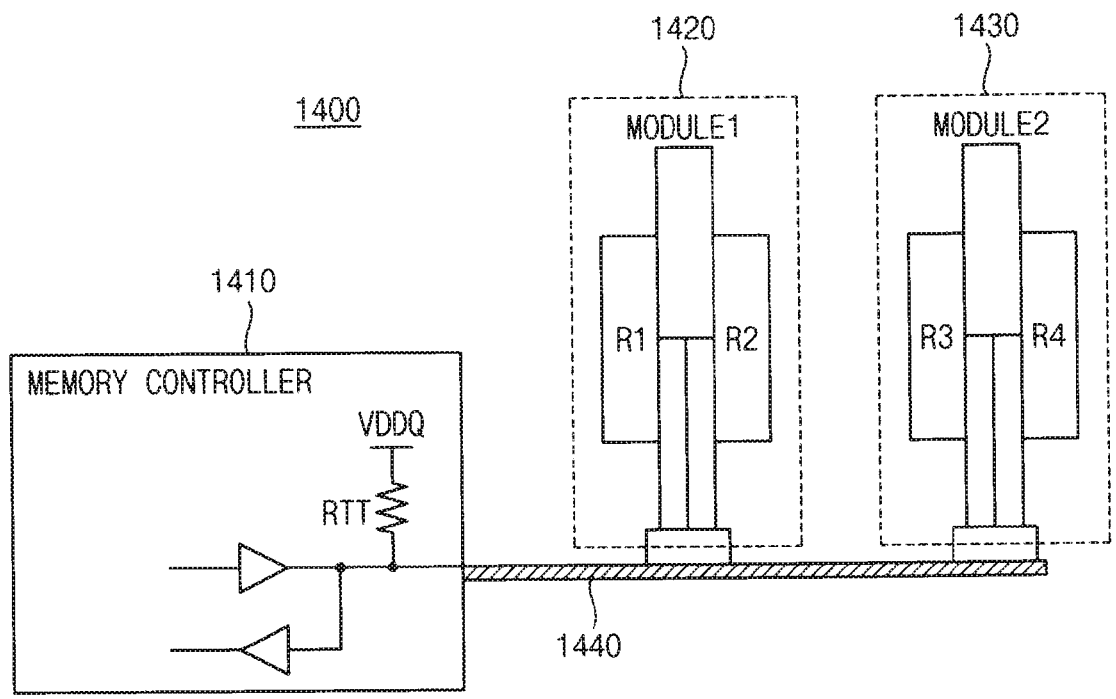
FIG. 20 is a block diagram illustrating a memory system incorporating a plurality of memory modules according to one or more embodiment of the inventive concept.

FIG. 20 is a block diagram illustrating a memory system incorporating one or more memory modules according to one or more embodiment of the inventive concept.

Referring to FIG. 20, a memory system 1400 includes a memory controller 1410 and at least one memory module 1420 and 1430.

A first memory module 1420 and a second memory module 1430 may be coupled to a memory controller 1410 via a bus 1440. Each of the first memory module 1420 and the second memory module 1430 may be one of the memory modules 100, 200, 300, 400, 500, 600 and 700a of FIGS. 1 through 7, one of the memory modules 700b, 700c, 800 and 900 of FIG. 9 through 12, or one of the memory modules 1100, 1200 and 1300 of FIGS. 14, 16 and 18.

The first memory module 1420 may include at least one memory rank R1 and R2, and the second memory module 1430 may include at least one memory rank R3 and R4. In some embodiments, the memory ranks R1, R2, R3 and R4 may be coupled in a multi-drop topology, which shares transmission lines. Each of the memory ranks R1, R2, R3 and R4 (or memory devices included in the memory ranks R1, R2, R3 and R4) may be arranged in a plurality of rows, may be connected to at least one command/address register in a fly-by daisy-chain topology or in a fly-by ring topology and may be terminated to at least one module resistor unit which provide termination resistance of Rtt/2. Therefore, each of the memory ranks R1, R2, R3 and R4 (or memory devices included in the memory ranks R1, R2, R3 and R4) may reduce the number and resistance of the module resistor unit.

Figure 21:
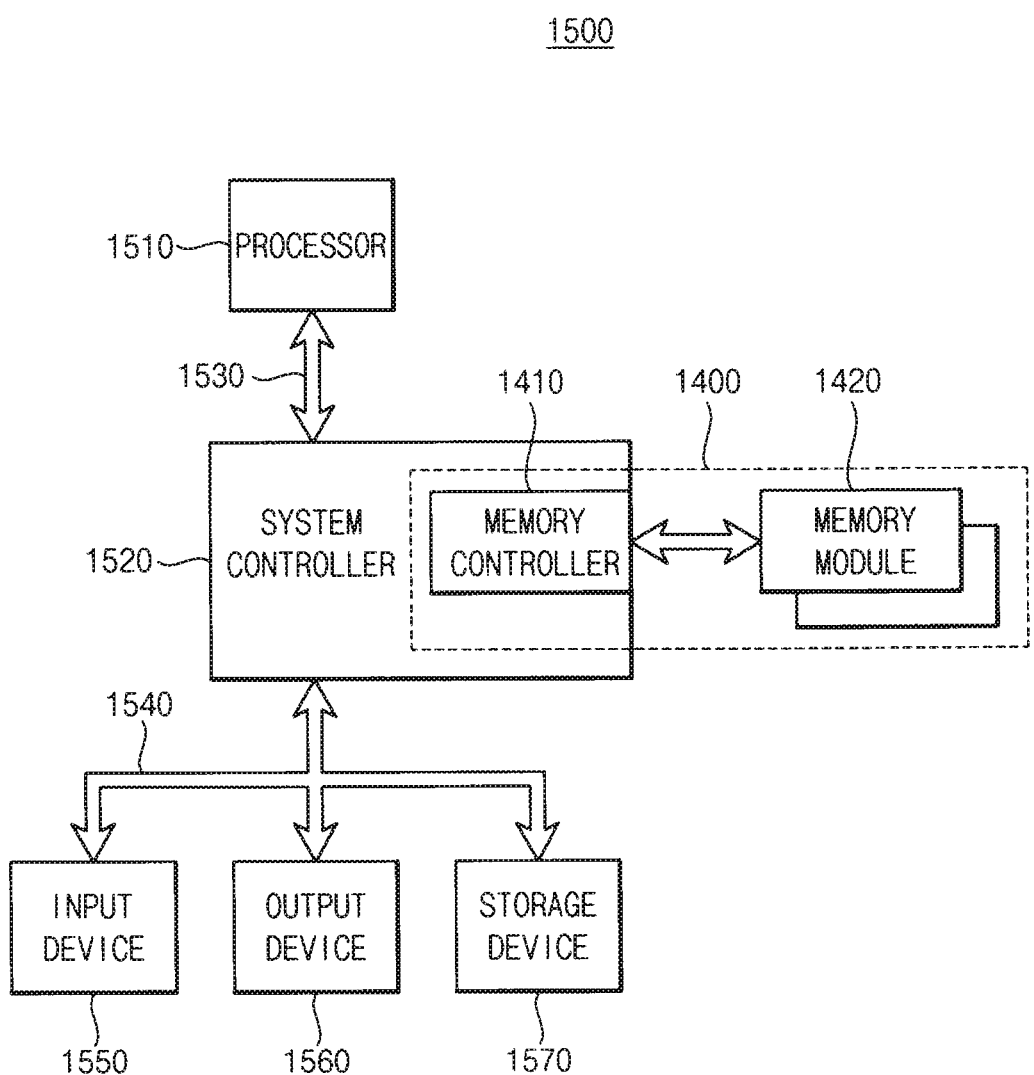
FIG. 21 is a block diagram illustrating a computational incorporating one or more memory modules according to embodiment(s) of the inventive concept.

FIG. 21 is a block diagram illustrating a computational system incorporating one or more memory modules according to certain embodiments of the inventive concept.

Referring to FIG. 21, a computational system 1500 includes a processor 1510, a system controller 1520 and a memory system 1400. The computational system 1500 may further include a processor bus 1530, an extension bus 1540, an input device 1550, an output device 1560, and a storage device 1570. The memory system 1400 may include at least one memory module 1420, and a memory controller 1410 for controlling the memory module 1420. The memory module 1420 may be included in the system controller 1520.

The processor 1510 may perform various computational functions, such as executing specific software for performing specific calculations or tasks. For example, the processor 1510 may be a microprocessor, a central process unit (CPU), a digital signal processor, or the like. The processor 1510 may be coupled to the system controller 1520 via the processor bus 1530 including an address bus, a control bus and/or a data bus. The system controller 1520 may be coupled to the expansion bus 1540, such as a peripheral-component-interconnect (PCI) bus. The processor 1510 may control the input device 1520, such as a keyboard, a mouse, the output device 1560, such as a printer, a display device, and the storage device 1570, such as a hard disk drive, a compact disk read-only memory (CD-ROM), a solid state drive (SSD).

The memory controller 1410 may control the memory module to perform a command provided form the processor 1510. The memory module 1420 may store data provided from the memory controller 1410, and may provide the stored data to the memory controller 1410. The memory module 1420 may include a plurality of memory devices, such as a dynamic random access memory (DRAM), a static random access memory (SRAM), a non-volatile memory, etc.

The computational system 1500 may be applicable to a desktop computer, a notebook, a computer, a work station, a handheld device, or the like.

As described above, memory modules according to certain embodiments of the inventive concept may functionally assign a sub-plurality of memory devices in a rank that corresponds with a row or row section. The assigned sub-plurality of memory devices may be connected to a command/address register via an internal CA transmission line (or alternately, an internal CMD transmission line and an internal DDR transmission line) using a fly-by daisy-chain topology, or a fly-by ring topology, wherein the transmission line(s) are terminated in one or more module resistor unit(s) providing a termination resistance of Rtt/2 relative to conventional memory modules row-terminating an internal CA transmission line using a termination resistance of Rtt. Therefore, the memory modules according to the inventive concept allow for a reduced number of module resistor units and a lower termination resistance.

The foregoing is illustrative of the inventive concepts and is not to be construed as limiting thereof. Although a few embodiment of the inventive concepts have been described, those skilled in the art will readily appreciate that many modifications are possible in the embodiment of the inventive concepts without materially departing from the novel teachings and advantages of the inventive concept. Accordingly, all such modifications are intended to be included within the scope of the following claims. Therefore, it is to be understood that the foregoing is illustrative of various embodiment of the inventive concepts and is not to be construed as limited to the specific embodiment of the inventive concepts disclosed, and that modifications to the disclosed embodiment of the inventive concepts, as well as other embodiment of the inventive concepts, are intended to be included within the scope of the appended claims.

What is claimed is:

1. A memory module comprising:
a command/address (CA) register disposed at a central portion of a circuit board having a first edge and an opposing second edge, the CA register configured to receive an external CA signal and to provide a first internal CA signal and a second internal CA signal responsive to the external CA signal;
a plurality of memory devices arranged on the circuit board in a first row and a second row adjacent to the first row in a first direction, wherein the first and second rows extend in a second direction between the first and second edges;
a first internal CA transmission line extending from the CA register towards the second edge, and then proximate the second edge, extending back towards the first edge to traverse the first row in its entirety in a fly-by, daisy-chain topology and configured to communicate the first internal CA signal to each of the memory devices in the first row;
a second internal CA transmission line extending from the CA register towards the second edge, and then proximate the second edge, extending back towards the first edge to traverse the second row in its entirety in a fly-by, daisy-chain topology and configured to communicate the second internal CA signal to each of the memory devices in the second row; and
a module resistor unit configured to terminate the first and second internal CA transmission lines,
the module resistor unit comprising a termination resistor having a first end connected to a termination voltage and a second end connected to both the first and second internal CA transmission lines,
wherein a resistance of the termination resistor is half of a termination resistance required to terminate only one of the first and second internal CA transmission lines.

* * * * *